United States Patent
Varkony et al.

(10) Patent No.: US 10,147,734 B1
(45) Date of Patent: Dec. 4, 2018

(54) MEMORY GATE DRIVER TECHNOLOGY FOR FLASH MEMORY CELLS

(71) Applicant: Cypress Semiconductor Corporation, San Jose, CA (US)

(72) Inventors: Roni Varkony, Netanya (IL); Yoram Betser, Mazkeret Batya (IL)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/925,510

(22) Filed: Mar. 19, 2018

Related U.S. Application Data

(60) Provisional application No. 62/551,947, filed on Aug. 30, 2017.

(51) Int. Cl.
G11C 16/12 (2006.01)
H01L 27/11563 (2017.01)
G11C 16/14 (2006.01)
G11C 16/04 (2006.01)

(52) U.S. Cl.
CPC .... H01L 27/11563 (2013.01); G11C 16/0425 (2013.01); G11C 16/12 (2013.01); G11C 16/14 (2013.01)

(58) Field of Classification Search
CPC .................................................. G11C 16/0425
USPC .................................................... 365/185.18
See application file for complete search history.

(56) References Cited

U.S. PATENT DOCUMENTS

| | | | |
|---|---|---|---|
| 6,597,603 B2 | 7/2003 | Lambrache et al. | |
| 6,778,446 B2 | 8/2004 | Natori | |
| 7,110,295 B2 * | 9/2006 | Ishikawa | G11C 16/16 365/185.11 |
| 7,372,736 B2 | 5/2008 | Lee et al. | |
| 7,948,796 B2 * | 5/2011 | Fujimura | G11C 16/16 365/185.03 |
| 8,017,986 B2 | 9/2011 | Tanaka et al. | |
| 8,072,811 B2 * | 12/2011 | Lee | G11C 11/5628 365/185.17 |
| 8,289,775 B2 * | 10/2012 | Lee | G11C 11/5628 365/185.02 |
| 8,675,405 B1 | 3/2014 | Georgescu et al. | |
| 8,885,403 B2 * | 11/2014 | Hong | G11C 11/40 365/182 |
| 8,923,049 B2 * | 12/2014 | Lee | G11C 16/3459 365/185.05 |
| 9,030,874 B2 | 5/2015 | Aritome | |

(Continued)

OTHER PUBLICATIONS

International Search Report for International Application No. PCT/US18/48138 dated Sep. 24, 2018; 2 pages.

(Continued)

*Primary Examiner* — Son Mai

(57) ABSTRACT

A memory array including a first memory cell including a first memory gate coupled to receive a first signal. The memory array including a second memory cell including a first memory gate coupled to receive a second signal. The magnitude of the second signal is different than the magnitude of the first signal. The memory array including a third memory cell including a first memory gate coupled to receive a third signal. The magnitude of the third signal is different than the magnitude of the first signal and the magnitude of the second signal. The first signal, the second signal and the third signal are received concurrently.

19 Claims, 20 Drawing Sheets

(56) References Cited

U.S. PATENT DOCUMENTS

| | | | |
|---|---|---|---|
| 9,123,401 B2 * | 9/2015 | Tran .................. | G11C 5/145 |
| 9,449,655 B1 | 9/2016 | Zonte et al. | |
| 9,570,152 B1 | 2/2017 | Zain et al. | |
| 9,595,332 B2 * | 3/2017 | Georgescu .......... | G11C 16/08 |
| 9,704,585 B2 | 7/2017 | Georgescu et al. | |
| 2009/0052259 A1 * | 2/2009 | Arigane ............... | G11C 5/025 |
| | | | 365/185.29 |

OTHER PUBLICATIONS

Written Opinion of the International Searching Authority for International Application No. PCT/US18/48138 dated Sep. 24, 2018; 6 pages.

\* cited by examiner

Sector 200

MG Driver Circuitry 230

Group 210

SG <63:0>
MG <63:0>
SL <3:0>

Group 220

SG <64:127>
MG <64:127>
SL <4:7>

Group 230

SG <128:191>
MG <128:191>
SL <8:11>

Group 240

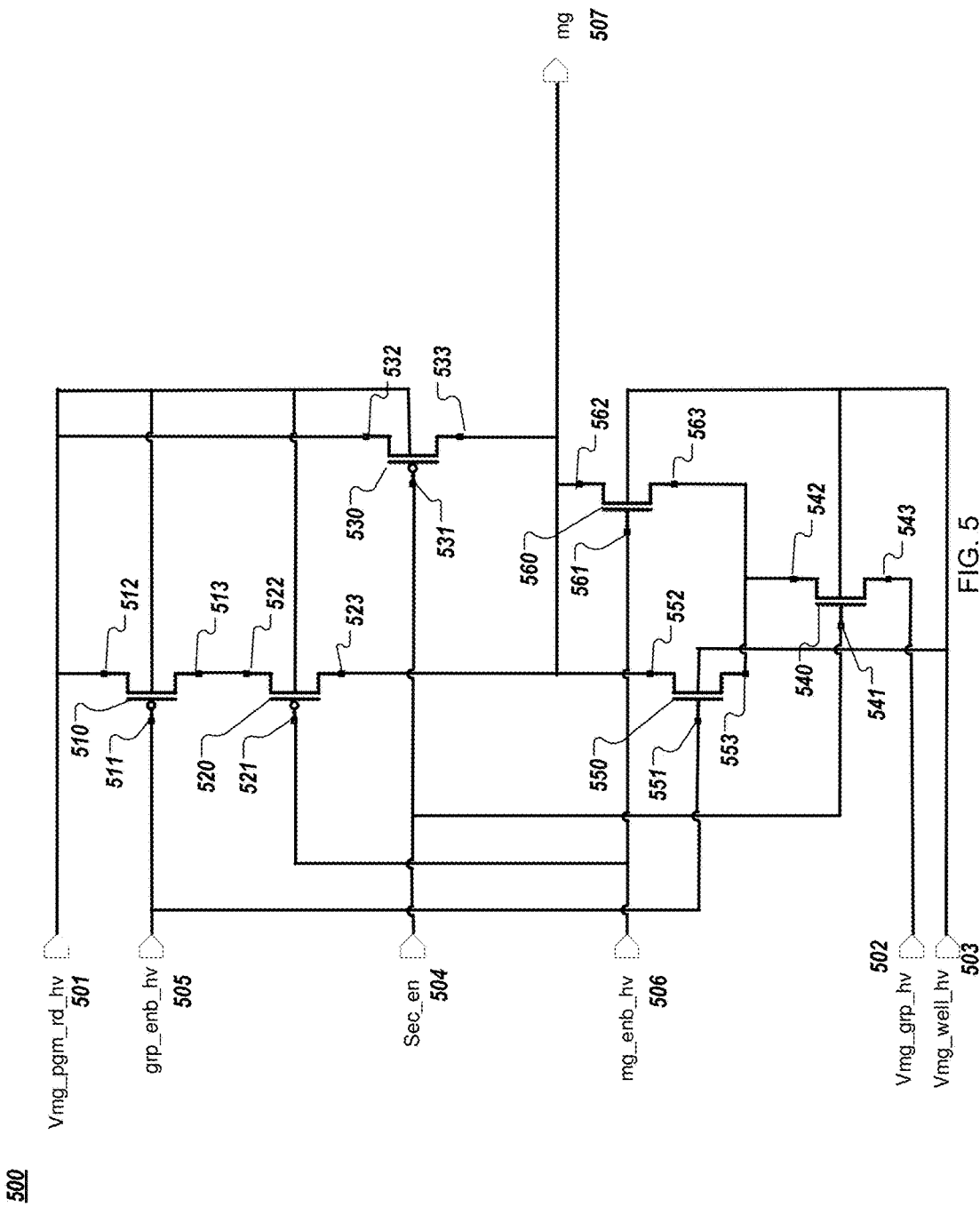

US 10,147,734 B1

MEMORY GATE DRIVER TECHNOLOGY FOR FLASH MEMORY CELLS

RELATED APPLICATIONS

This application claims the benefit of U.S. Provisional Application No. 62/551,947, filed on Aug. 30, 2017, the contents of which are hereby incorporated by reference herein.

BACKGROUND

Flash memory is utilized in various types of computing devices. Advances in technology of computing devices often times results in reducing the physical size of the computing devices. One way to reduce the size of a computing device is to reduce the size of the flash memory utilized by the computing device.

BRIEF DESCRIPTION OF THE DRAWINGS

The present disclosure is illustrated by way of example, and not by way of limitation, in the figures of the accompanying drawings.

FIG. 2 illustrates a sector of core memory cells coupled to memory gate driver circuitry, according to an embodiment.

FIG. 5 illustrates a memory gate driver, according to one embodiment.

DETAILED DESCRIPTION

One type of flash memory may include incorporating charge trapping transistors, such as the eCT flash memory of Cypress Semiconductor Corporation of San Jose, Calif. A flash memory device (e.g., non-volatile memory (NVM)) may have thousands or millions of core memory cells (e.g., NVM cell). Each core memory cell can include four nodes (or ports), the memory gate (MG), source line (SL) terminal, bit line (BL) terminal, and select gate (SG). In some embodiments of flash memory, the core memory cells can be arranged in array architecture where the memory cells may share an MG line and an SL.

While operating the eCT flash memory in various modes, the voltage signals to operate particular cell(s) at a particular mode may disturb other memory cells that are not intended to be in the particular mode. Additionally, non-active cells should be maintained in their idle state. Thus, there is a need for concurrent voltages in order to operate an active cell of the memory array at a particular mode, inhibit disturbing of other memory cells of the memory array, and maintain non-active cells of the memory array in their idle state. Moreover, there is a need to provide the concurrent multiple voltage signals such that there is minimum area penalty of the eCT flash memory.

The embodiments of the present disclosure address the above-mentioned deficiencies. As will be described in further detail below, different voltages are concurrently (and independently) driven in the eCT flash memory array. This is done by high-voltage driver circuitry and low-voltage driver circuitry, as described herein. The high-voltage/low-voltage driver circuitry drives a MG at one voltage and drives a MG of another cell at different voltage, as described herein. Moreover, the high-voltage driver circuitry has a minimum area penalty in the memory array, as described herein.

Figure 1:
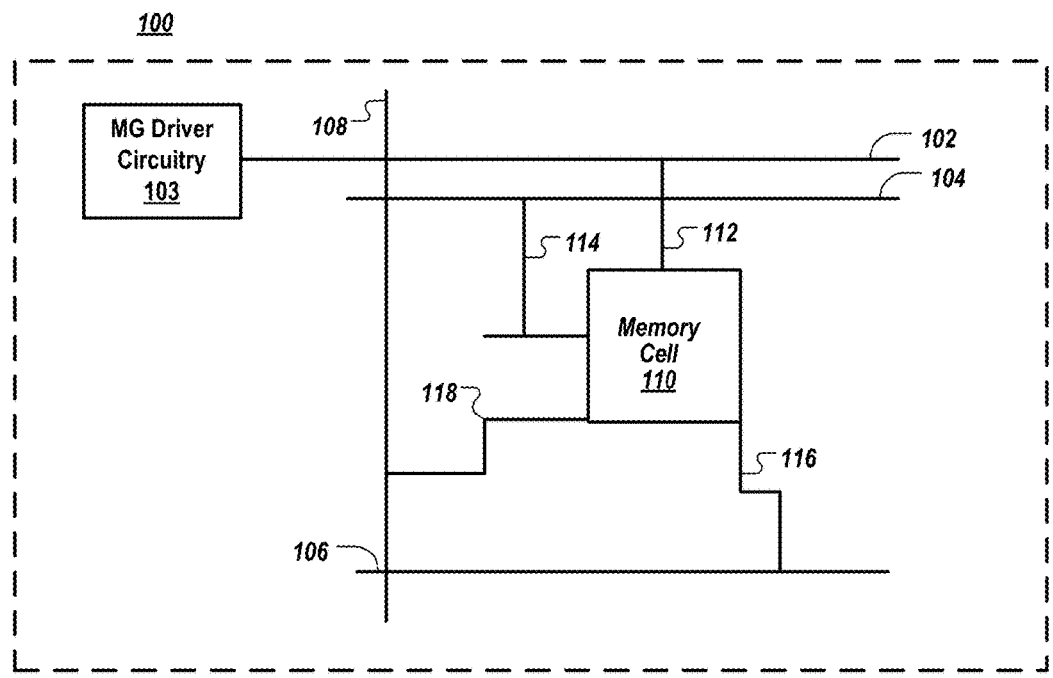
FIG. 1 illustrates a core memory cell coupled to memory gate driver circuitry, according to an embodiment.

FIG. 1 depicts flash memory array 100, according to an embodiment. Flash memory array 100 includes an array of core memory cells such as memory cell 110 (e.g., NVM cell). Although a memory array includes numerous memory cells, for the sake of clarity and efficiency, FIG. 1 depicts one memory cell (e.g., memory cell 110). In one embodiment, memory cell 110 includes MG 112 (also referred to as an actual gate), SG 114, SL terminal 116 and BL terminal 118. In one embodiment, MG 112 is a high-voltage (HV) MG and SG 114 is low-voltage (LV) SG. To enable high speed read access, the MG is driven to some voltage level allowing a fast LV access through the SG. As shown in FIG. 1, MG 112 is coupled to MG line 102, SG 114 is coupled to SG line 104, SL terminal 116 is coupled to SL 106, and BL terminal 118 is coupled to BL 108. In one embodiment, memory cell 110 may have a split-gate (1.5 transistor (T)) configuration, two-transistor (2T) configuration, or other configurations. Memory arrays, described herein, may have various architectures (e.g., FIGS. 4A-C) which will be described in further detail below.

Memory cell 110 is operative in various modes based, in part, on signals (e.g. voltage signals) provided to MG 112 (via MG driver circuitry 103). Various modes of operation can be, but are not limited to, program (PGM), read (RD), erase (ERS), verify (VT), inhibit and test. Additional description and functionality of the various modes will be described in further detail below.

FIG. 2 illustrates an embodiment of physical sector 200 of a flash memory array (e.g., flash memory array 100). In one embodiment, a flash memory array includes numerous physical sectors.

Physical sector 200 includes groups of memory cells. For example, physical sector 200 includes group 210 of memory cells, group 220 of memory cells, group 230 of memory cells and group 240 of memory cells. Alternatively, a physical sector can include more or less groups than the four groups depicted in FIG. 2.

As shown in FIG. 2, the groups of memory cells include multiple MG lines, SLs and SG lines. The groups also include multiple BLs (e.g., 64 BL lines not shown). For example, each group includes 64 different MG lines, 64 different SG lines and four different SLs. However, it should be appreciated that the groups in sector 200 can include more or less MG lines, SLS and SG lines. As shown in FIG. 2, sector 200 includes 256 MG lines, 256 SG lines and 16 SLs. However, sector 200 can include more or less MG lines, SG lines and SLs.

In one embodiment, a group of memory cells shares the same BLs (not shown). Additionally, a group of memory cells receives (or shares) the same "group" supply voltage signal (e.g., vmg_grp voltage signal) from MG driver circuitry 230, which will be described in further detail below.

The MG lines may be shorted in an interleaved fashion (not shown). However, the MG lines may be shorted in a non-interleaved fashion. In one embodiment, the short is done in the area of the MG driver (e.g., MG driver circuitry 103) and not in the memory core. Alternatively, the short may be done outside the area of the MG driver (e.g., MG driver circuitry 103) and may be done in the memory core.

It should be appreciated that MG driver circuitry 230 is coupled to each MG line to drive various voltages to the memory cells coupled to the respective MG lines. In one embodiment, a single MG driver is coupled to four MG lines in a group. Accordingly, for each group, there are 16 separate and distinct MG drivers coupled to the MG lines. As such, sector 200 includes 64 separate MG drivers to drive the 256 MG lines. Additional description of the MG driver circuitry will be provided in further detail below.

Figure 3:
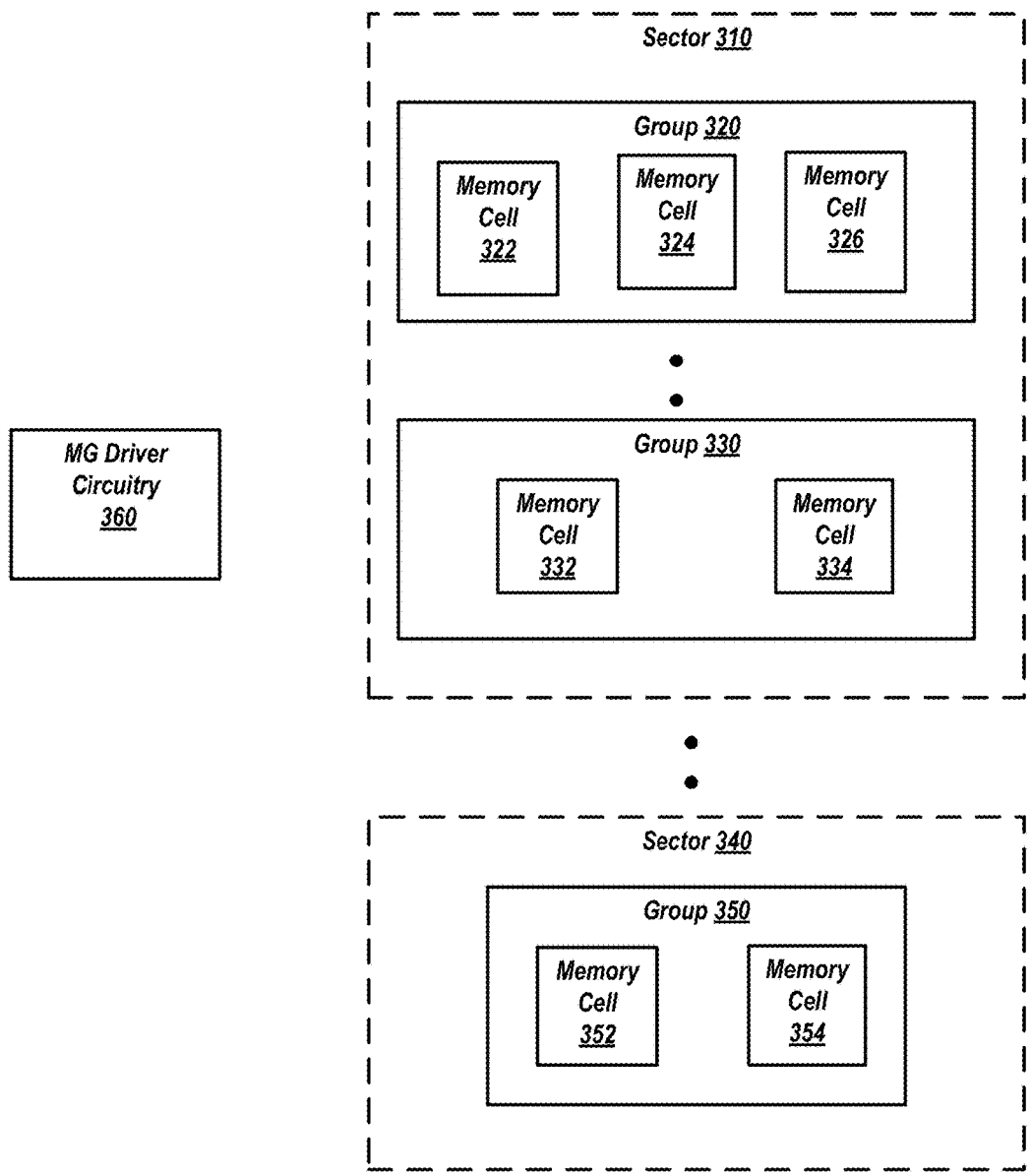
FIG. 3 illustrates a plurality of sectors of core memory cells coupled to memory gate driver circuitry, according to an embodiment.

FIG. 3 illustrates multiple sectors (e.g., sector 310 and 340) of memory cells in flash memory array 300. It should be appreciated that memory array 300 can include any number of sectors. Sector 310 includes at least groups 320 and 330. It should be appreciated that any sector in memory array 300 can include any number of groups (e.g., four groups). In one embodiment, sector 310 is the same as sector 200 of FIG. 2.

Group 320 of sector 310 includes numerous memory cells (e.g., memory cell 110). For example, group 320 includes at least memory cell 322, memory cell 324, and memory cell 326. In one embodiment, memory cells 322 and 324 are coupled to different MG lines and are in the same SL group. In one embodiment, memory cell 326 is coupled to a different SL group in group 320 than the SL group of memory cells 322 and 324.

Group 330 of sector 310 includes numerous memory cells. For example, group 330 includes memory cells 332 and 334. In one embodiment, group 330 corresponds to group 220 of FIG. 2. Memory array 300 also includes other sectors, such as sector 340. Sector 340 includes one or more groups such as group 350. Group 350 includes numerous memory cells such as memory cells 352 and 354.

In one embodiment, each physical sector (e.g., physical sectors 310 through 340) shares the same BLs (and other lines, such as one or more SLs). Also, the physical sectors are physically separated from each other by select transistors.

As described above, the memory architecture described herein supports several modes of operation (e.g., read, program, erase, and verify). Referring again to FIG. 1, in program mode of memory cell 110 (e.g., logical value=0), MG 112 of memory cell 110 receives a high positive voltage signal (e.g., +8 volts (V) to 10V). As a result, electrons are trapped inside the memory cell by using channel hot electron injection. When the memory cell is programmed, the current measured at the programmed memory cell (e.g., a small current) indicates whether the memory cell is programmed. It will be the understanding that the allocation of the logical values of "1" and "0" to the erased and programmed states, respectively, are for illustrative purposes only, not to be construed as limitations.

In erase mode (e.g., logical value=1), MG 112 receives a high negative voltage signal (e.g., −7 to −10V). As a result, trapped electrons (if any) are removed from the memory cell by recombination with holes injected using tunneling assisted band-to-band (BTB) hole injection. In read mode, MG 112 receives a medium positive voltage.

In general, the VT mode is similar to a Read mode operation. However, in the VT mode, the memory cell is provided with different voltage signals at the MG terminal in order to analyze the cell conditions across the whole window of operation (e.g., from erase state to program state). For example, referring to Table 1 below, during the VT mode, three different voltage signals (e.g., −3V, 0.1V, 5.5V) are provided to the MG terminal. It should be appreciated that different voltages may be provided to the MG terminal in VT mode. Additionally, it should be appreciated that more or less different voltage signals may be provided to the MG terminal in VT mode.

The VT mode is provided after an erase function or after a program function. For example, after an erase function, the VT mode is provided to verify if the erase function was properly operated on the memory cell. More specifically, during VT mode, a first voltage (e.g., −3V) is provided to the memory cell, then a second voltage (e.g., 0.1V) is provided to the memory cell, and then a third voltage (e.g., 5.5. V) is provided to the memory cell. Similarly, after a program function, the VT mode is provided to verify if the program function was property operated on the memory cell.

A test mode is used for testing of the memory array. For example, a HV or LV signal is supplied to multiple cells to stress the cells. In order to validate the memory array, it is determined if any of the stressed cells have shorts or opens. In another embodiment, a test mode is provided to determine the appropriate inhibit conditions. For example, an inhibit test determines the optimal groups of memory cells to inhibit during program or erase modes.

Table 1, below, describes the various voltage signals provided to a memory cell (e.g., memory cell 110/322) for the different modes of operation. It should be appreciated that the values in Table 1 is an embodiment of different voltage levels at each terminal of a memory cell during different modes of operation.

TABLE 1

|  | MG | SL | SG | BL |
|---|---|---|---|---|
| Read (RD) | 3.5 V | 0 V | 1.2 V | 1.1 V |
| Program (PGM) | 10 V | 5.5 V | 1.2 V | 0.5 V |
| Erase (ERS) | −8 V | 5.5 V | 0 V | Float |
| Verify (VT) | −3:0.1:5.5 V | 0 V | 1.2 V | 1.1 V |

For example, during a read mode at a memory cell, the MG of a memory cell is supplied with a 3.5V signal, the SL terminal is supplied with a 0V signal, the SG is supplied with a 1.2V signal, and the BL terminal is supplied with a 1.1V signal. As shown in Table 1, the MG supply voltage for the read mode is less than the MG supply voltage for the program mode. Additionally, the MG supply voltage for the erase mode is less than the MG supply voltage for the program mode (and the read mode).

Table 2, below, describes the various ranges of voltage signals provided to a memory cell (e.g., memory cell 110/322) for the different modes of operation. It should be appreciated that the range of voltage values in Table 2 is an embodiment of different voltage range levels at each terminal of a memory cell during different modes of operation.

TABLE 2

|  | MG | SL | SG | BL |
|---|---|---|---|---|
| Read (RD) | 2 to 6 V | 0 V | 0.9 to 1.35 V | 0.9 to 1.35 V |
| Program (PGM) | 10 V | 4 to 7 V | 0.9 to 1.35 V | 0 to 0.5 V |
| Erase (ERS) | −7 to −10 V | 4 to 7 V | 0 | Float |
| Verify (VT) | −4:0.1:7.5 V | 0 V | 0.9 to 1.35 V | 0.9 to 1.35 V |

As shown in Table 2, the range of MG supply voltages for the read mode is less than the MG supply voltage for the program mode. Additionally, the range of MG supply voltages for the erase mode is less than the MG supply voltage for the program mode (and the read mode). Referring to Tables 1 and 2, it should be appreciated that the different voltage levels can be different ranges. These ranges can be overlapping or non-overlapping ranges.

As shown in Tables 1 and 2, in each mode, the selected MG line in a group is supplied with the desired voltage (e.g., Table 1: 3.5V in read mode, 10V in program mode, and −8V in erase mode). The unselected MG lines in the same physical sector and in other non-active sectors need to maintain some voltage level to avoid disturbs and to also be ready for read operation.

The avoidance of disturbs is based on a unique MG/SL combination. As described above, in a group, there are four separate SL lines and four MG lines that are shared with a single MG driver which creates different MG/SL combinations. As a result, when a MG line is set to a high-voltage (HV) level and an SL line is set to a HV level, a single MG/SL combination (e.g., one out of 64 combination) is active. For the other MG/SL combinations (e.g., 63 out of 64 combinations), if a MG line is HV then the SL would be low-voltage (LV) (e.g., ground=0V), and if a SL is set to a HV level then the MG line would be set to a LV (or low enough voltage to sufficiently prevent a disturb). In other words, for the 63 MG/SL combinations that are not in an active state, the following MG/SL voltage levels would be: (1) MG=HV and SL=LV, (2) MG=LV and SL=HV, (3), MG=LV and SL=LV.

Table 3, below, describes the state of the active MG line and other MG lines during various modes. As a result, disturbs of memory cells are avoided and memory cells are ready for a read operation. It should be appreciated Table 3 is an embodiment of different voltage levels at various MG lines during different modes of operation.

TABLE 3

|  | RD | PGM | ERS | VT |
|---|---|---|---|---|
| Active MG line | 3.5 V | 10 V | −8 V | −3 V:5.5 V |
| Non-active MG line; same SL group | 3.5 V | 4 V | 2 V | −3 V:5.5 V |
| Non-active MG line; different SL group (in active sector) | 3.5 V | 3.5 V | 2 V | 2 V |
| Non-active sector | 3.5 V | 3.5 V | 3.5 V | 3.5 V |

As shown in Table 3, during the program and erase operations, there are three different and concurrent MG voltage signals provided to the memory core. For example, during the program operation, there is a 10V signal provided to an active MG line (e.g., the MG line that is activated for the program operation), a 4V signal provided to a non-active MG line in the same SL group as the active MG line, and a 3.5V signal provided to a non-active MG line in a different SL group (in an active sector). A 3.5V signal is also provided to MG lines in a non-active sector.

Referring to at least Table 3 and FIG. 3, in one embodiment, during a program operation, memory cell 322 is coupled to the active MG line and is provided a 10V signal at the MG, memory cell 324 is coupled to a non-active MG line (and in the same SL group as memory cell 322) and provided a 4V signal at the MG, memory cell 326 is coupled to a non-active MG line (and in a different SL group than memory cell 322 in the active sector) and provided a 3.5V signal at the MG. Additionally, other memory cells in a non-active sector (e.g., memory cells 352 and 354 in sector 340) are provided a 3.5V signal at their respective MGs.

Referring again to Table 3, in another example, during the erase operation, there is a −8V signal provided to the active MG line, a 2V signal provided to a non-active MG line in the same SL group as the active MG line, and a 3.5V signal is also provided to MG lines in a non-active sector. Additionally, a 2V signal is provided a non-active MG line in a different SL group (in an active sector).

Referring again at least Table 3 and FIG. 3, in one embodiment, during an erase operation, memory cell 322 is coupled to the active MG line and is provided a −8V signal at the MG, memory cell 324 is coupled to a non-active MG line (and in a different SL group than memory cell 322 in the active sector) and provided a 2V signal at the MG, memory cell 326 is coupled to a non-active MG line (and in a different SL group than memory cell 322) and provided a 2V signal at the MG. Additionally, other memory cells in a non-active sector (e.g., memory cells 352 and 354 in sector 340) are provided a 3.5V at their respective MGs.

Figure 4A:
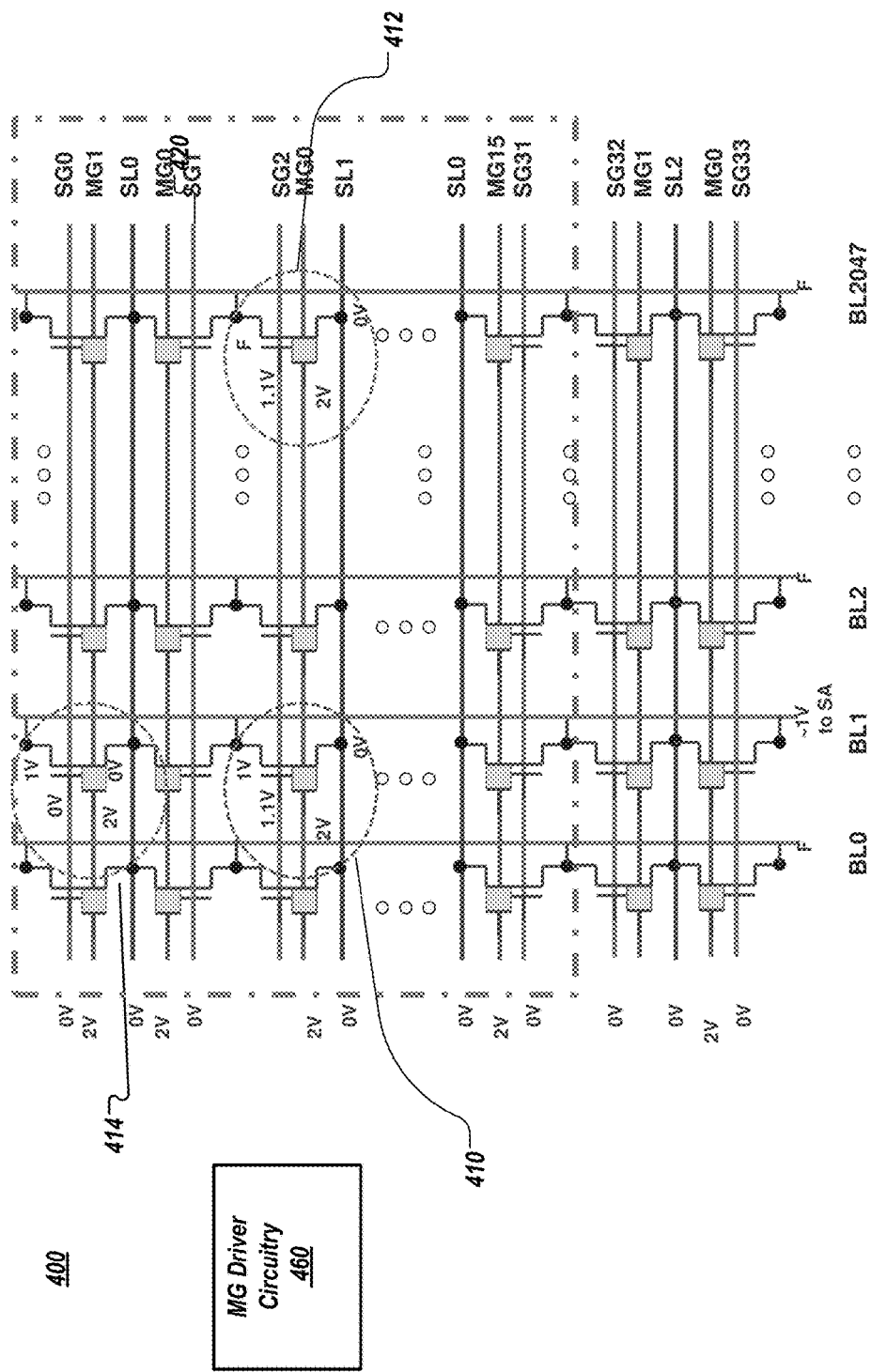
FIG. 4A illustrates an array of core memory cells coupled to a memory gate driver circuitry during a read operation, according to one embodiment.
Figure 4B:
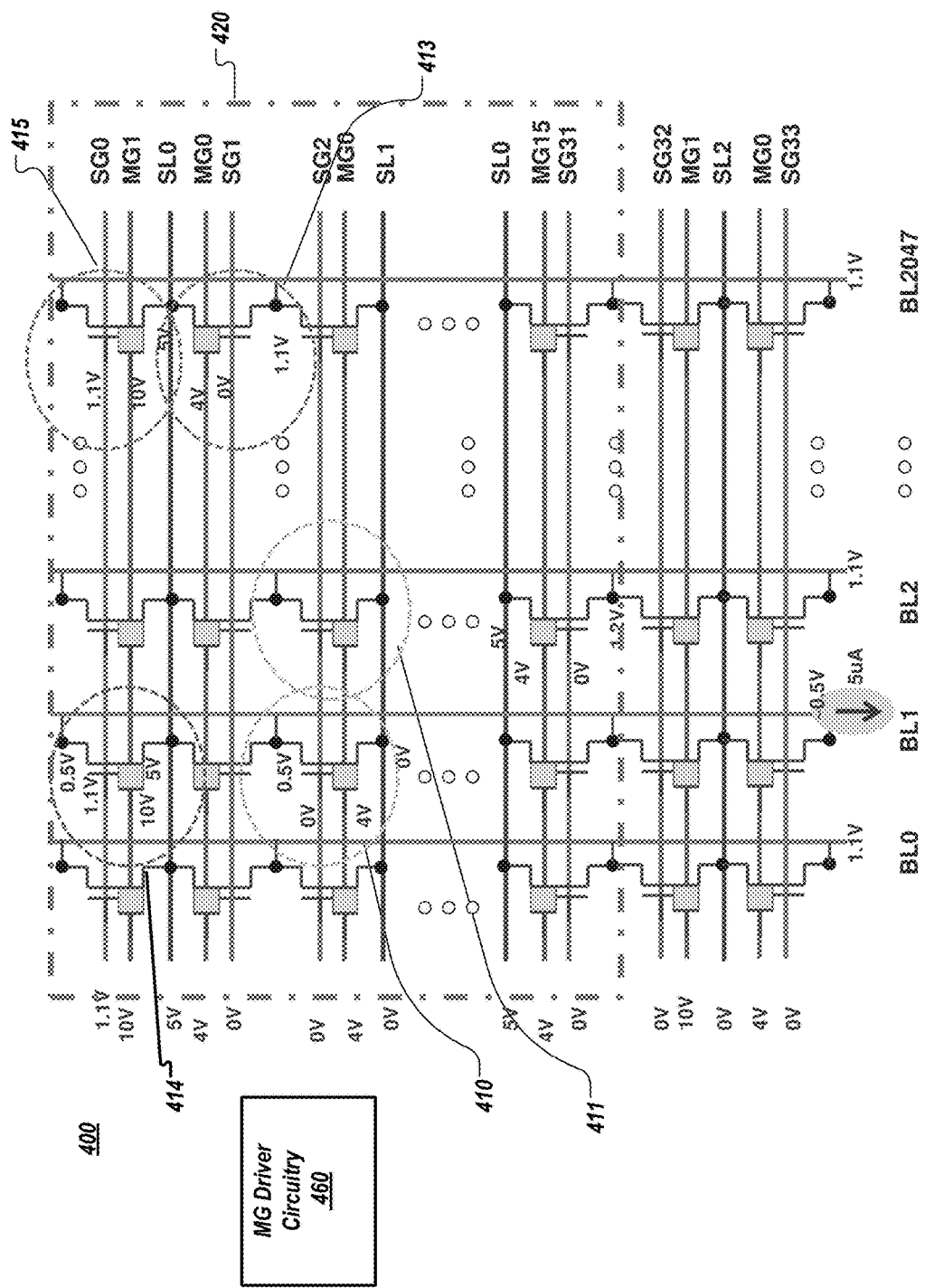
FIG. 4B illustrates an array of core memory cells coupled to a memory gate driver circuitry during a program operation, according to another embodiment.
Figure 4C:
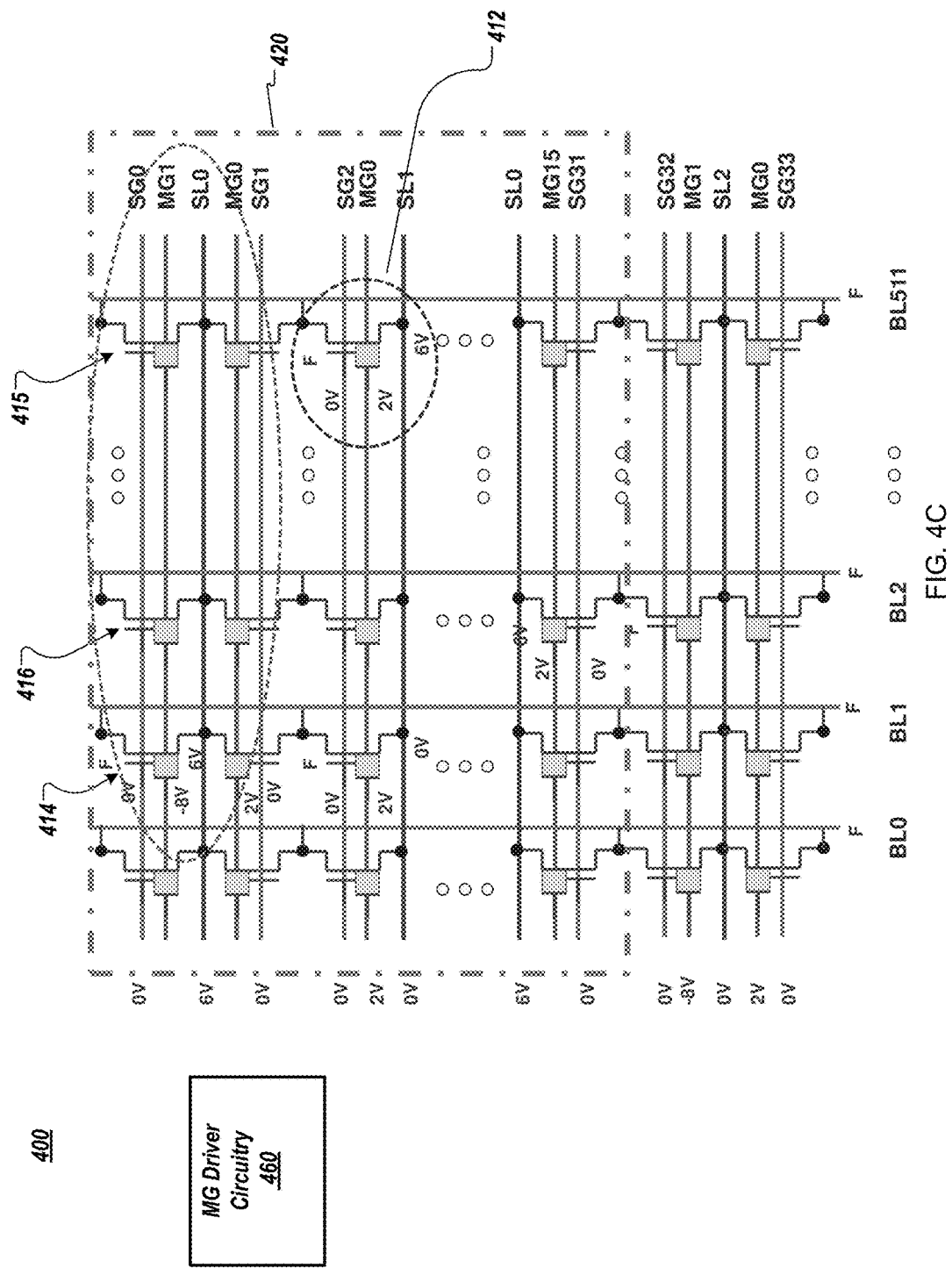
FIG. 4C illustrates an array of core memory cells coupled to a memory gate driver circuitry during an erase operation, according to another embodiment.

FIGS. 4A-C depicts embodiments of a memory array 400 during various modes of operation (e.g., read, program and erase). FIGS. 4A-C depicts an embodiment of memory architecture of memory array 400. However, it should be appreciated that other architectures may be implemented. As shown in FIGS. 4A-C, the memory cells share at least some of the same MGs and SGs (and also the SLs) in the x-direction, and share the BLs in the y-direction. In one embodiment, at least some of the BLs and SLs are shared in the y-direction. In particular, FIGS. 4A-C depicts embodiments of voltage levels, such as MG voltage levels, during the various modes of operation at least with respect to Tables 1-3.

FIG. 4A depicts an embodiment of memory array 400 during a read operation. Group 420 of memory array, in one embodiment, includes memory cells 410 and 412 that share an MG line (e.g., MG0) and memory cell 414 that is coupled to a different MG line (e.g., MG1). FIG. 4A depicts memory cell 410 in a read mode. Referring to Table 2 and FIG. 4A, during the read operation, the MG of memory cell 410 has a 2V signal (via MG0). At memory cell 410, the SL (SL1) has a 0V signal, the SG line has a 1.1V signal, and the BL has a 1V signal.

Still referring to FIG. 4A, the active MG line (e.g., MG0) has a 2 signal, a non-active MG line (e.g., MG1) in the same SL group has a 2V signal. Additionally, a non-active MG line in a different SL group and in an active sector (not shown) has a 2V signal, MG lines in a non-active sector (not shown) also have a 2V signal. The voltage signals to the MG lines in memory array 400 are provided by MG driver circuitry 460. The SL signals and the SG line signals in memory array 400 are provided by a SL driver and SG driver, respectively.

As shown in FIG. 4A, memory cell 414 has a different SG line voltage of 0V (e.g., closed SG line). As such, memory cell 414 is not in read mode. Additionally, memory cell 412 also shares the same SG line (e.g., SG2) and SL (e.g., SL1) as memory cell 410. However, memory cell 412 has a floating BL signal that is different than the BL voltage signal of memory cell 410. As such, memory cell 412 is not in read mode. It is noted that during read operation and VT mode, the bit lines for the non-active cells could be either Float, as shown in FIG. 4A, GND or could even be driven to some voltage level from one side but disconnected from a sense-amplifier on the other side (by bit-line select transistors (not shown)). The general difference between active BL and non-active BL is whether it is connected or not to the sense-amplifier.

FIG. 4B depicts an embodiment of memory array 400 during a program operation. Group 420 of memory array, in one embodiment, includes at least memory cells 410, 411 and 413 that share an MG line (e.g., MG0) and memory cells 414 and 415 that are coupled to a different MG line (e.g., MG1). FIG. 4B depicts memory cell 414 in a program mode.

Referring to at least Table 2, during the program operation, the MG terminal of memory cell 414 has a 10V signal (via MG1). At memory cell 414, the SL (SL0) has a 5V signal, the SG line has a 1.1V signal, and the BL has a 0.5V signal.

During programming of memory cell 414, memory cells 410, 411, 413, and 415 are disturbed cells. In various embodiments, there could be more or less disturbed cells. A disturbed cell is a memory cell (in proximity to the active cell) that has the potential to be unintentionally be set to a mode of an active memory cell based on signals provided to the active memory cell. During the programming of memory cell 414, memory cells 410 and 411 are provided with a 4V inhibit signal and with SL voltage=0V (SL1). The above condition inhibits memory cells 410 and 411 from being in the program mode.

Also, during programming of memory cell 414, disturbed memory cells 413 and 415 (that share the same BL) have a different BL signal than memory cell 414. Accordingly, memory cells 413 and 414 are not subjected to the program mode.

FIG. 4C depicts an embodiment of memory array 400 during an erase operation. Group 420 of memory array 400, in one embodiment, includes at least memory cells 414, 415 and 416 that share an MG line (e.g., MG1) and memory cell 412 that is coupled to a different MG line (e.g., MG0). FIG. 4C depicts memory cells 414-416 in an erase mode.

Referring to at least Table 2, during the erase operation, the MGs of memory cells 414-416 each have a −8V signal (via MG1). At memory cells 414-416, the SL (SL0) has a 6V signal, the SG line has a 0V signal, and the BL has a float (F) signal.

During the erase operation of memory cells 414-416, memory cell 412 (a disturbed cell), which is in a non-active MG line (e.g., MG0) is provided with a 2V inhibit signal and SL=0V (SL1). The above condition inhibits memory cell 412 from being in the erase mode.

Referring to FIGS. 4A-C, in various embodiments, a SL is shared in the x-direction and also partially share in the y-direction. For example, SL0 is depicted to be the SL line on many different MG lines. In some embodiments, there are two (or even four) shorted MG lines (e.g., MG0). Each will have its own separate SL line (e.g., SL0, 1, 2, 3 . . . ).

As can be seen from Tables 1-3 and associated figures, there are different and concurrent voltages supplied to different MG lines. In one embodiment, during a program operation, the active MG line is supplied with a first voltage (e.g., 10V), non-active MG lines (in the same SL group) are inhibited to a regulated second voltage (e.g., 4V). Other non-selected MG lines are at a third voltage (e.g., read mode of 3.5V).

In another embodiment, during an erase operation, active MG lines are set at a first voltage (e.g., −8V). Non-active MG lines in the same group are at a second voltage (e.g., 2V. Other non-selected MG lines are set at a third voltage (e.g., read mode of 3.5V).

In an embodiment, during the VT operation, active MG lines are driven to a voltage within a range of −3V:5.5V, and non-selected MG lines are at a read mode of 3.5V.

FIG. 5 depicts an embodiment of a gate-control circuitry 500 (or MG driver circuitry) that supports the driving of different and concurrent voltages to respective MG lines. It should be appreciated that MG driver circuitry (e.g., 103, 230, 360, and 460) includes one or more circuitry 500. As will be described in further detail below, circuitry 500 generates different MG signals associated with different modes of operation.

Circuitry 500 includes six transistors 510, 520, 530, 540, 550 and 560. Each transistor includes a gate and two terminals. For example, transistor 510 includes gate 511, first terminal 512 and second terminal 513. Transistor 520 includes gate 521, first terminal 522 and second terminal 523. Transistor 530 includes gate 531, first terminal 532 and second terminal 533. Transistor 540 includes gate 541, first terminal 542 and second terminal 543. Transistor 550 includes gate 551, first terminal 552 and second terminal 553. Transistor 560 includes gate 561, first terminal 562 and second terminal 563.

Circuitry 500 includes two supply signals 501 (Vmg_pg-m_rd_hv) and 502 (Vmg_gp_hv). Typically, supply signal 501 (a positive or high voltage) comes from a PMOS path, where PMOS transistors are used to path the supply. However NMOS transistors can also be used for the same purpose. Supply signal 501 is the "top" supply per sector of MG lines and is a decoded positive supply (e.g., eight decoded signals). In various embodiments, supply signal 501 supplies (1) the read voltage to each of the MGlines, (2) the program voltage to the active MG line during program mode, (3) the inhibit voltage to the non-active MG lines during erase mode, and (4) the read voltage to the reference MG lines during the verify modes.

In various embodiments, supply signal 501 is dedicated per a physical sector. For example, if there are eight physical sectors, then there would be eight different Vmg_pgm_rd_hv signals routed—one per each sector. However, it should be appreciated that various method could be implemented to connect a number of Vmg_pgm_rd_hv signals to a number of sectors.

Supply signal 502 is a "bottom" supply per sector of MG lines and is a decoded supply (e.g., four decoded signals) that can be both positive and negative. In various embodiments, supply signal 502 supplies (1) the read voltage to non-selected groups during read mode, (2) supplies the verify voltage during the verify mode, and (3) the negative voltage during the erase mode to the selected MG lines. Supply signal 502 is a global bus (typically a four line bus) serving each of the physical sectors in a memory array. Pwell supply signal 503 (Vmg_well_hv), in various embodiments, supplies (1) ground during read and program modes, and (2) negative voltage during the erase mode.

Circuitry 500 includes three high voltage control signals 504 (sec_en), 505 (grp_enb_hv), and 506 (mg_enb_hv). Control signal 504 enables an active physical sector (e.g., 256 MG lines). Control signal 505, a 4 bit bus, selects a group of MG lines (e.g., 64 MG lines) from the MG lines in the active physical sector. Control signal 506, a 16 bit bus, selects one of the MG lines in the selected group.

In one embodiment, transistor 510 of circuitry 500 is coupled to receive supply signal 501 at first terminal 512 and control signal 504 at gate 511. Transistor 520 is coupled to receive control signal 506 at gate 521. Transistor 530 is coupled to receive control signal 505 at gate 531 and supply signal 501 at terminal 532. Transistor 540 is coupled to receive supply signal 502 at terminal 543. Transistor 550 is coupled to receive control signal 505 at gate 551. Transistor 560 is coupled to receive control signal 506 at gate 561. Output node 507 is coupled to terminal 533 of transistor 530, and terminal 562 of transistor 560. Output node 507 is also coupled to a MG of memory cell.

Figure 6:
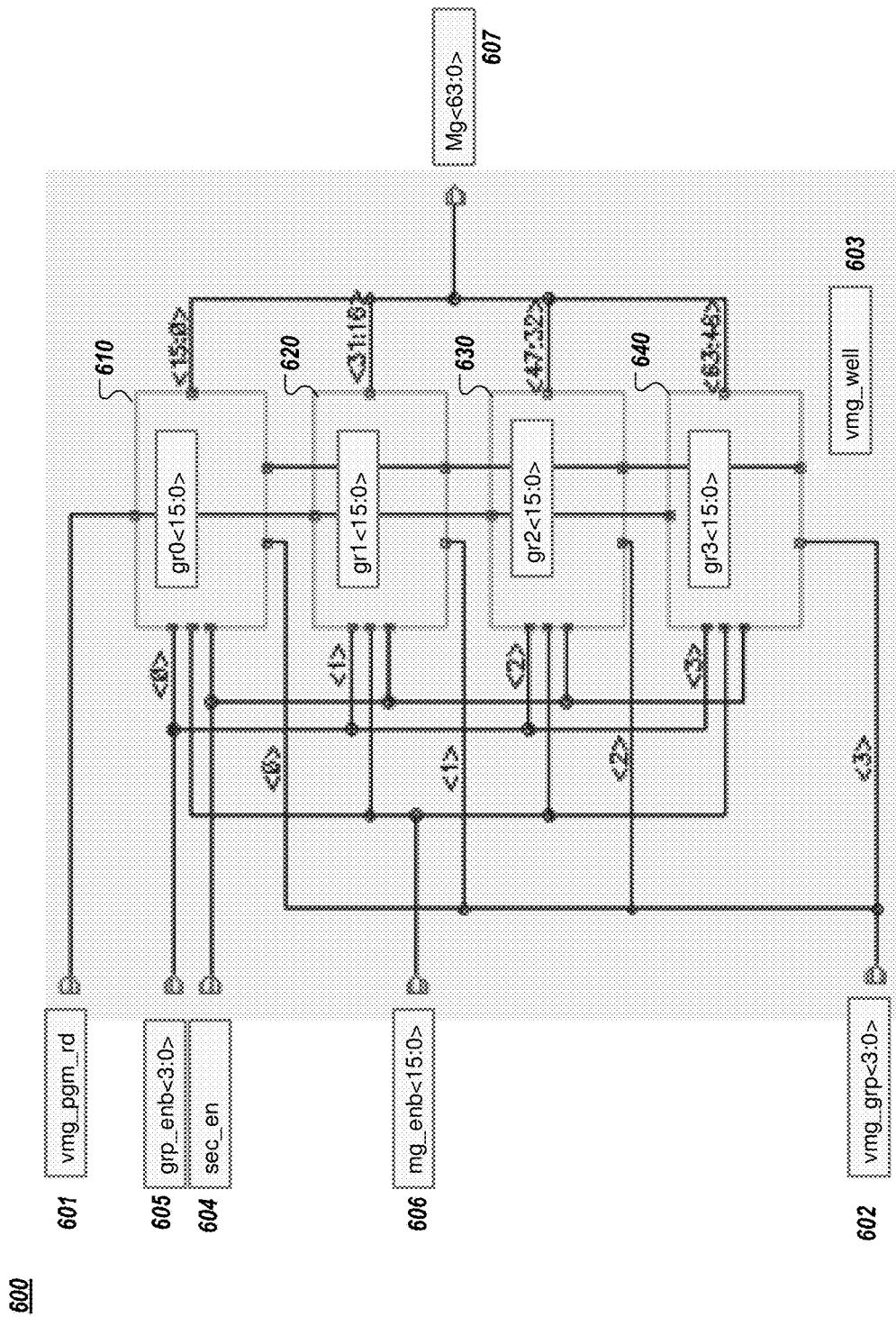
FIG. 6 illustrates controls and voltage supply signals for a physical sector of memory cells, according to one embodiment.

The controls and supply signals may be shared by several groups and sectors. Accordingly, by proper decoding a single (or more) MG line can be accessed. FIG. 6 depicts an embodiment of MG driver circuitry 600. MG driver circuitry 600 illustrates the connectivity of the controls and supply signals for a physical sector.

Similar to circuitry 500, circuitry 600 includes: (1) two supply signals 601 (Vmg_pgm_rd_hv) and 602 (Vmg_gp_hv), and Pwell supply signal 603, (2) three high voltage control signals 604 (sec_en), 605 (grp_enb_hv), and 606 (mg_enb_hv), and (3) output node 607.

Circuitry 600 includes circuitry 610, 620, 630 and 640 that respectively correspond to control of a group in a sector. For example, in one embodiment, a sector of memory cells includes four groups of memory cells. Multiple MG lines (e.g., 64 MG lines) may be shared in a group of memory cells. Accordingly, circuitry 610 controls the multiple MG lines (e.g., 16 MG drivers drive 64 MG lines) in a first group, circuitry 620 controls multiple MG lines (e.g., 16 MG drivers drive 64 MG lines) in a second group, circuitry 630 controls multiple MG lines (e.g., 16 MG drivers drive 64 MG lines) in a third group, and circuitry 630 controls multiple MG lines (e.g., 16 MG drivers drive 64 MG lines) in a fourth group. Accordingly, circuitry 600 is capable of controlling multiple MG lines (e.g., 64 MG drivers drive 256 MG lines) in a sector.

In one embodiment, circuitry 610, 620, 630 and 640 each includes one or more gate-control circuitry 500 (or MG drivers). For example, circuitry 610 includes sixteen separate and distinct gate-control circuitry 500 that are respectively coupled to 64 MG lines in the first group (e.g., one gate-control circuitry 500 is coupled to four MG lines). Each gate-control circuitry 500 (or MG driver) in circuitry 610 is then able to control its respective MG line(s) in the group of memory cells in the sector. For example, to control a respective MG line(s), control signal 604 enables the active physical sector of the respective MG line(s), control signal 605 selects the group of MG lines of the respective MG line, and control signal 606 selects the respective MG line(s) in the selected group.

Similarly, circuitry 620, 630 and 640 each include multiple separate and distinct gate-control circuitry 500 that are respectively coupled to multiple MG lines in their respective group. Accordingly, circuitry 600 is able to concurrently drive three separate voltages corresponding to three separate modes of operation (e.g., erase, inhibit and read) to three separate MG lines.

Figure 7A:
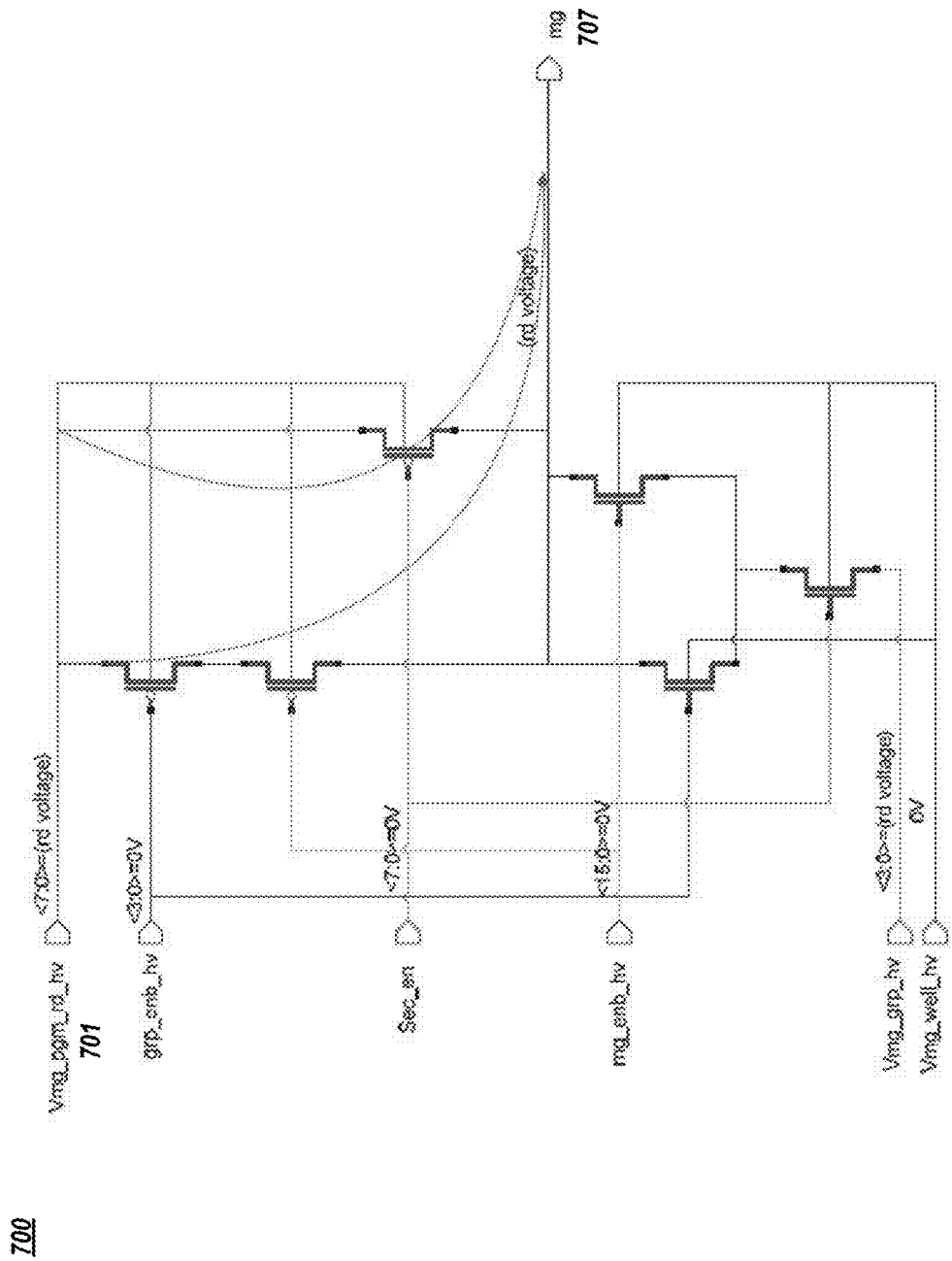
FIG. 7A illustrates a memory gate driver providing a memory gate signal, according to an embodiment.

FIGS. 7A-I depicts embodiments of gate-control circuitry 700 (or MG driver circuitry) during various modes of operation. In one embodiment, gate-control circuitry 700 is the same as at least gate-control circuitry 500. In one embodiment, output node 707 is coupled to an MG line in a memory array. FIG. 7A depicts circuitry gate-control 700 during read mode. In read mode, all groups and MG lines in a physical sector are supplied by signal 701 (e.g., vmg_pgm_rd). The memory cells coupled to the MG line (that is coupled to output node 707) receive signal 701 at their respective MG terminal.

Figure 7B:
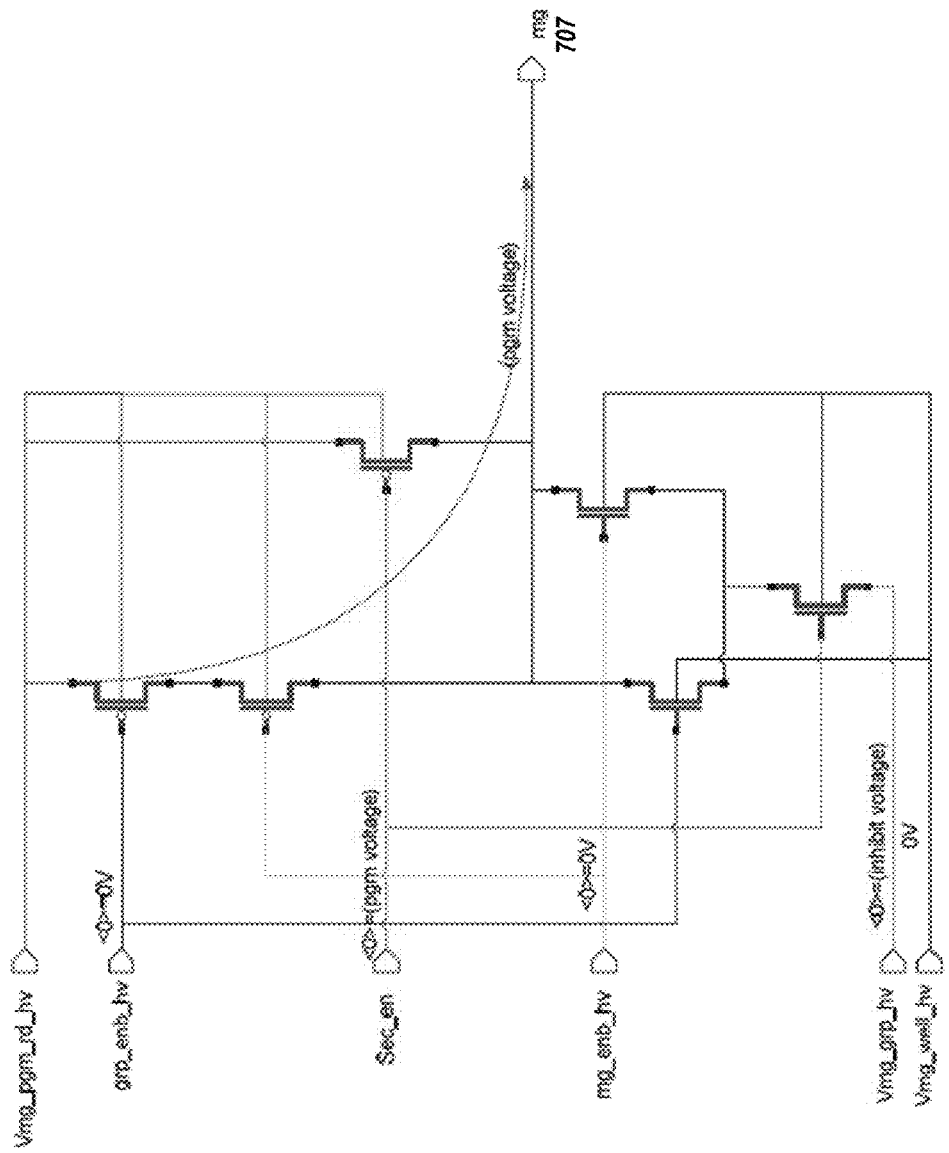
FIG. 7B illustrates a memory gate driver providing a memory gate signal, according to another embodiment.

FIGS. 7B-E depicts embodiments of gate-control circuitry 700 providing various output signals associated with the program mode. FIG. 7B depicts gate-control circuitry 700 driving a signal for a program mode. In program mode, the selected MG line is driven to the program mode level. It is noted that other MG lines sharing the same SL are inhibited, while the rest of the memory array is drive to read mode.

Figure 7C:
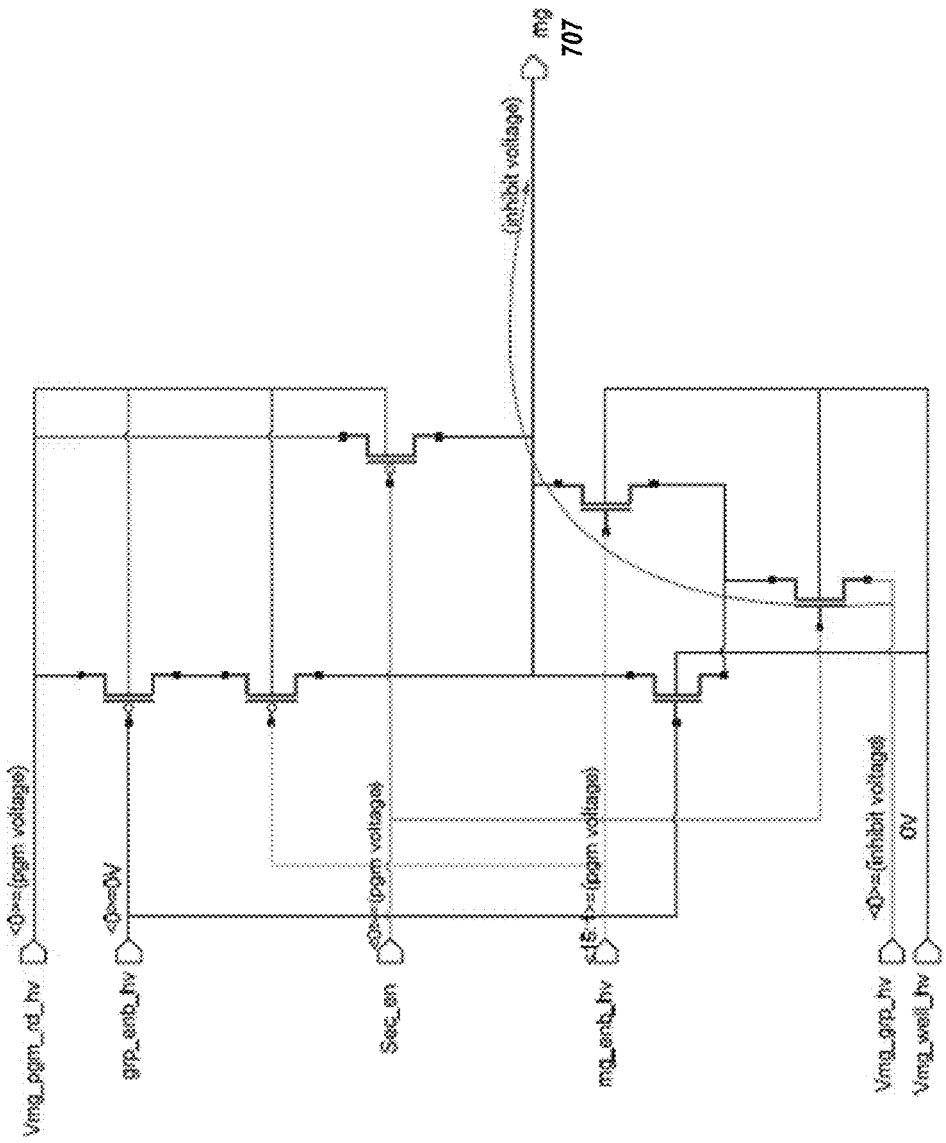
FIG. 7C illustrates a memory gate driver providing a memory gate signal, according to one embodiment.

FIG. 7C depicts gate-control circuitry 700 during inhibit mode. For example, output node 707 is coupled to an MG line sharing the same SL as the active MG line (in program mode). Accordingly, the MG line coupled to node 707 (in FIG. 7C) is driven to the inhibit voltage.

Figure 7D:
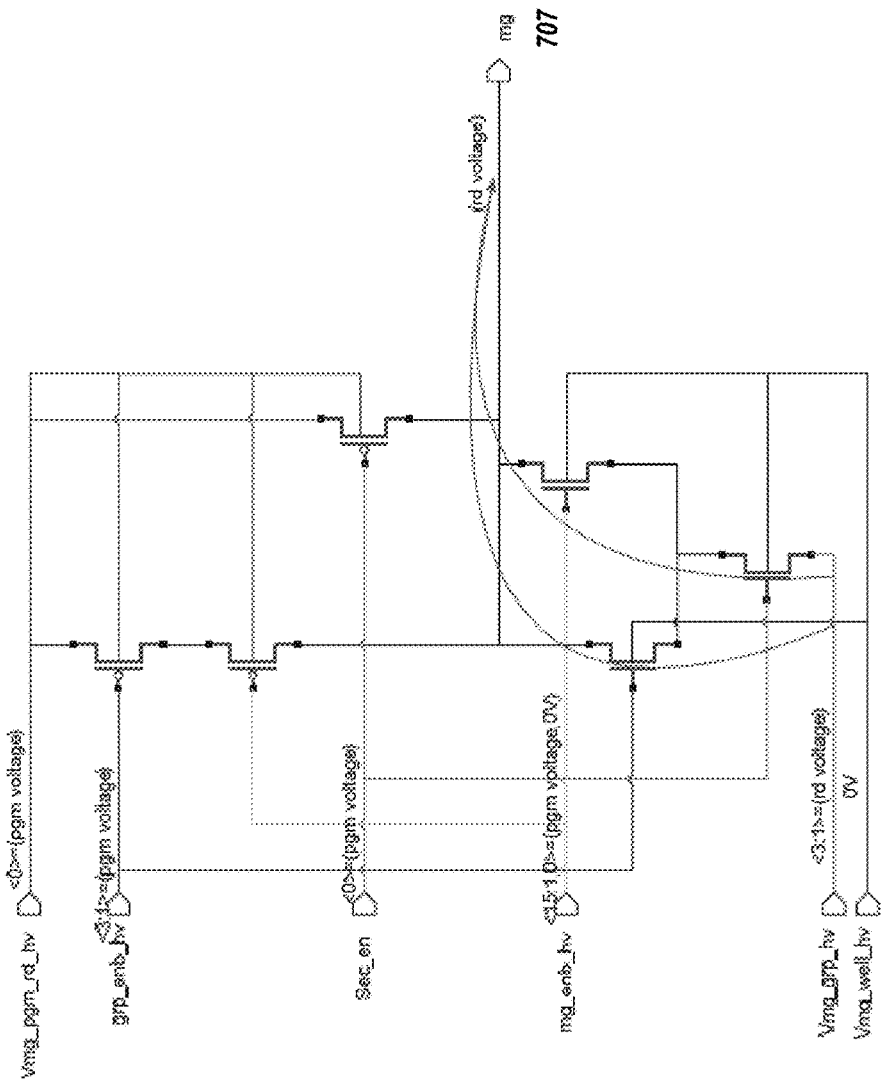
FIG. 7D illustrates a memory gate driver providing a memory gate signal, according to one embodiment.
Figure 7E:
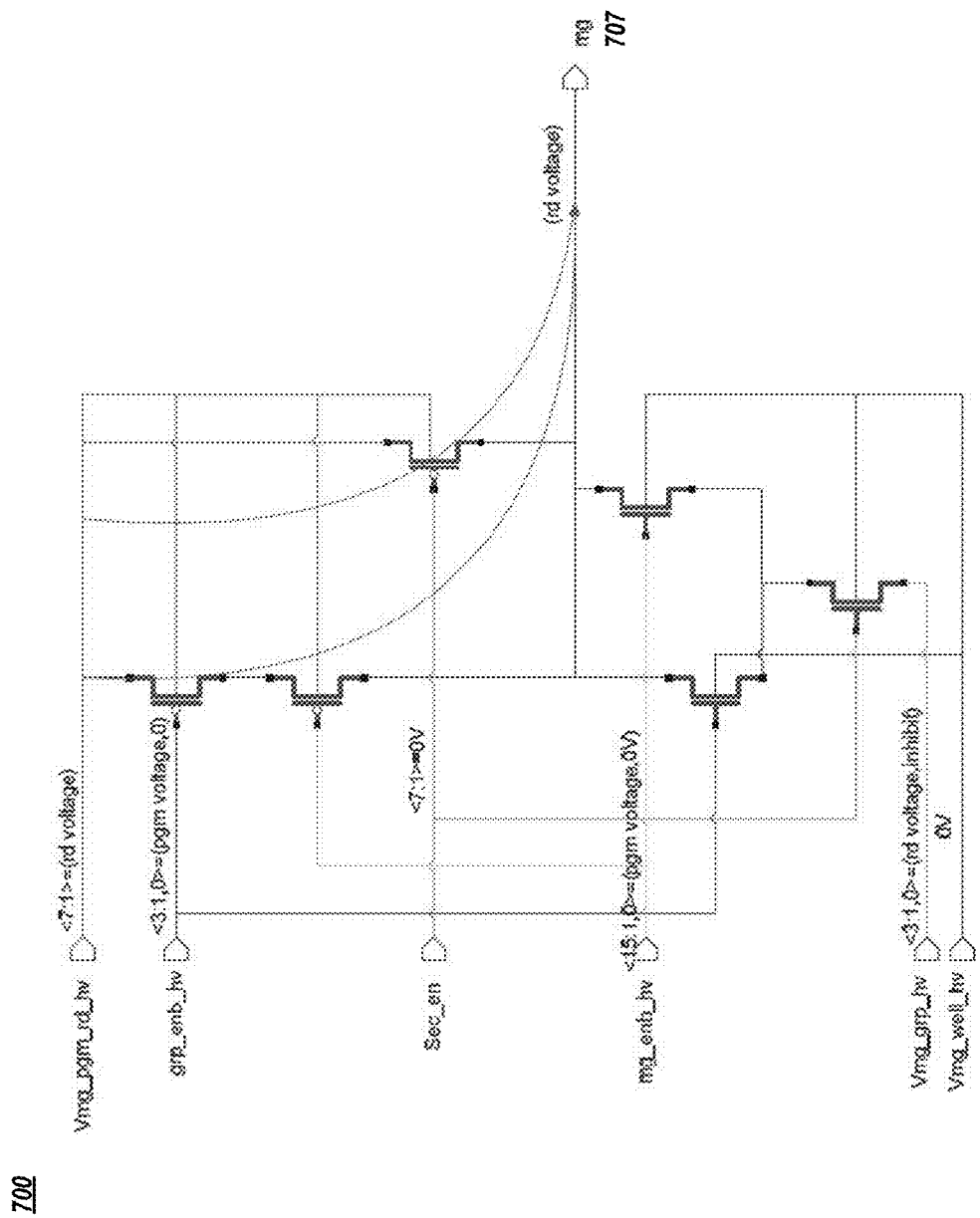
FIG. 7E illustrates a memory gate driver providing a memory gate signal, according to an embodiment.

FIG. 7D depicts gate-control circuitry 700 driving an unselected MG line (during program mode) in an active sector to a read level. Accordingly, the MG line coupled to node 707 (in FIG. 7D) is driven to the read voltage. FIG. 7E depicts gate-control circuitry 700 driving an unselected MG line (during program mode) in a non-active sector to a read level. Accordingly, the MG line coupled to node 707 (in FIG. 7E) is driven to the read voltage.

Figure 7F:
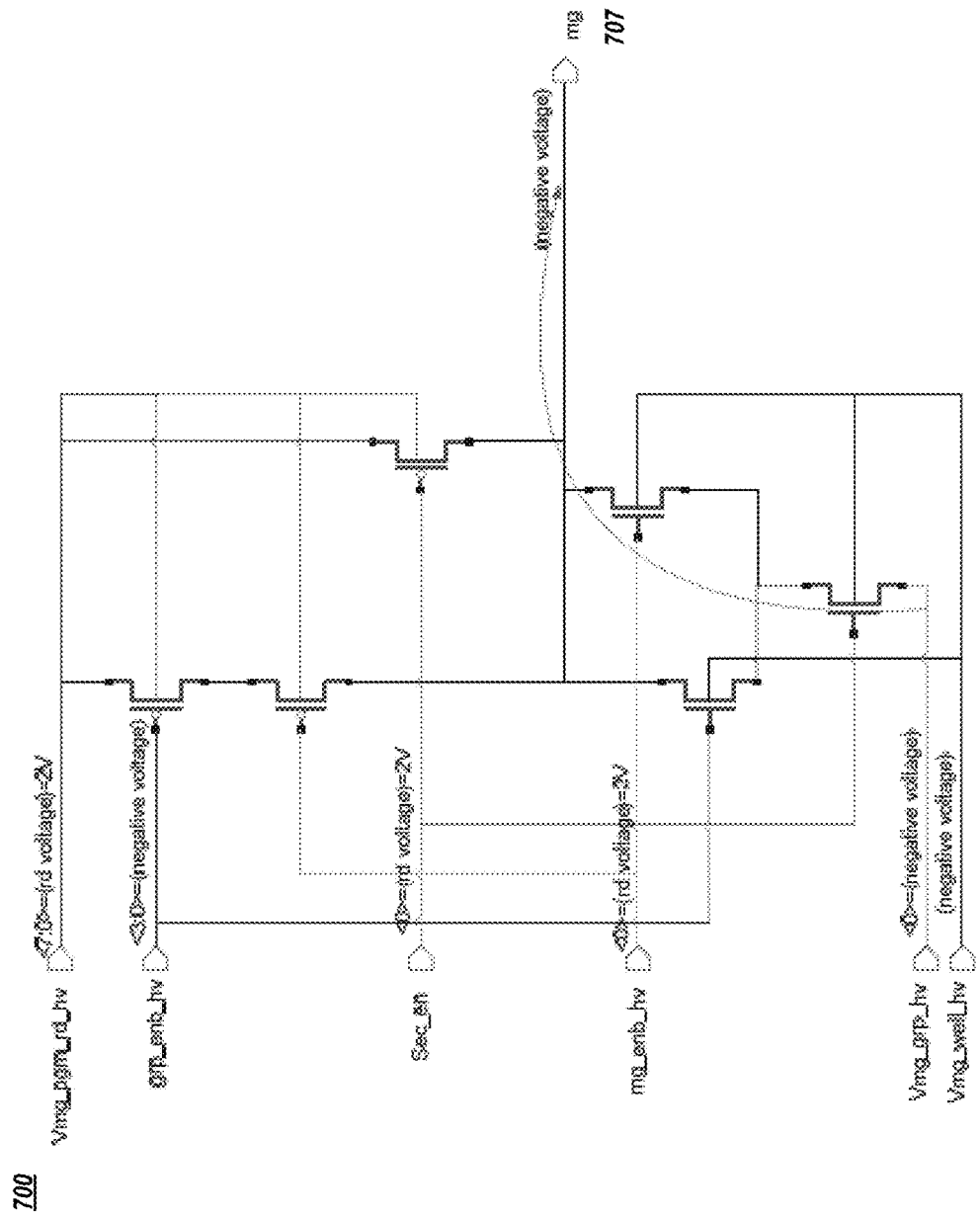
FIG. 7F illustrates a memory gate driver providing a memory gate signal, according to another embodiment.

FIGS. 7F-I depicts embodiments of gate-control circuitry 700 providing various output signals associated with an erase mode. FIG. 7F depicts gate-control circuitry 700 driving a signal for an erase mode. In erase mode, the selected MG line is driven to a negative voltage. During erase mode, the rest of the MG lines are either in read mode or at ground (active MG in non-selected group).

Figure 7G:
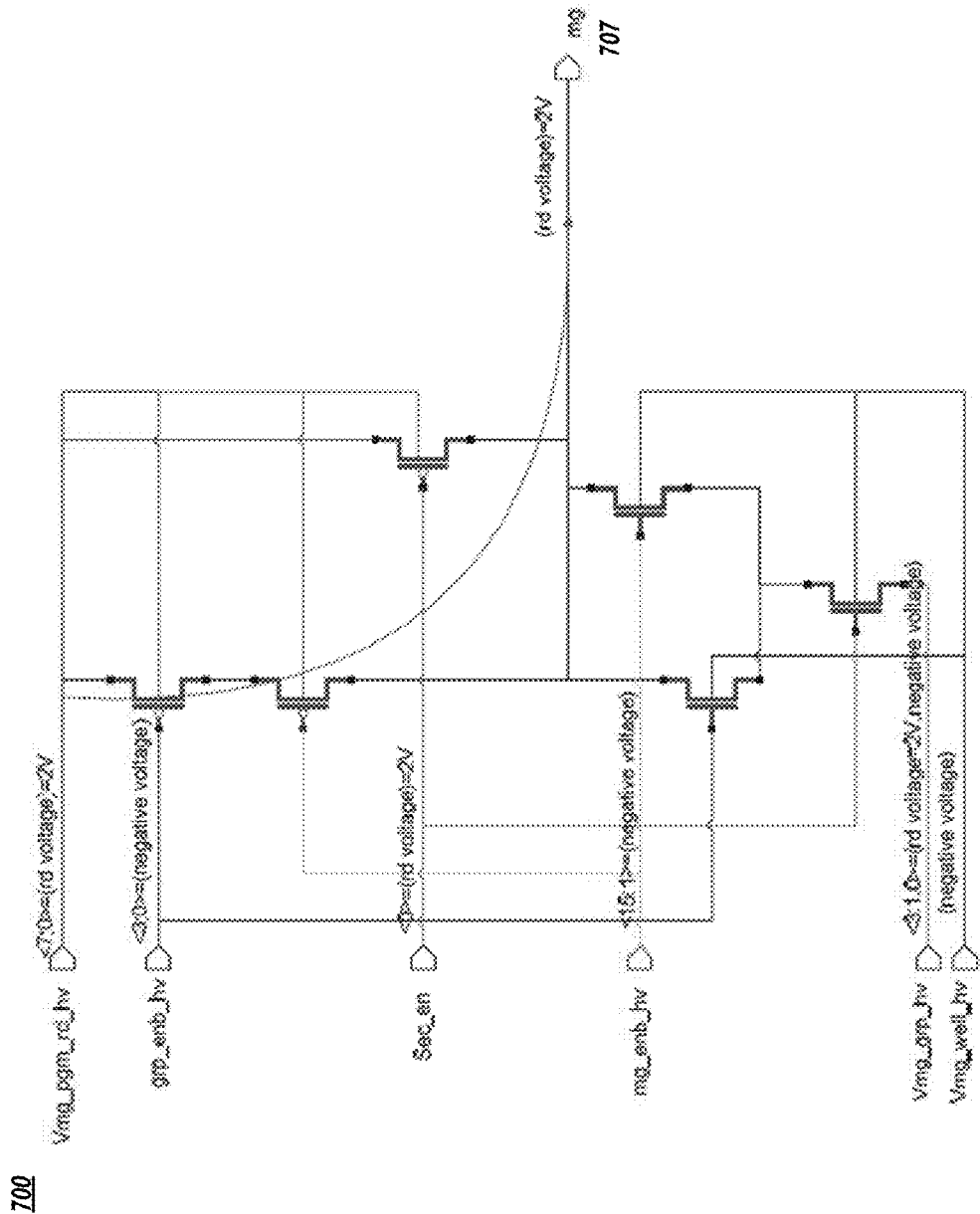
FIG. 7G illustrates a memory gate driver providing a memory gate signal, according to another embodiment.
Figure 7H:
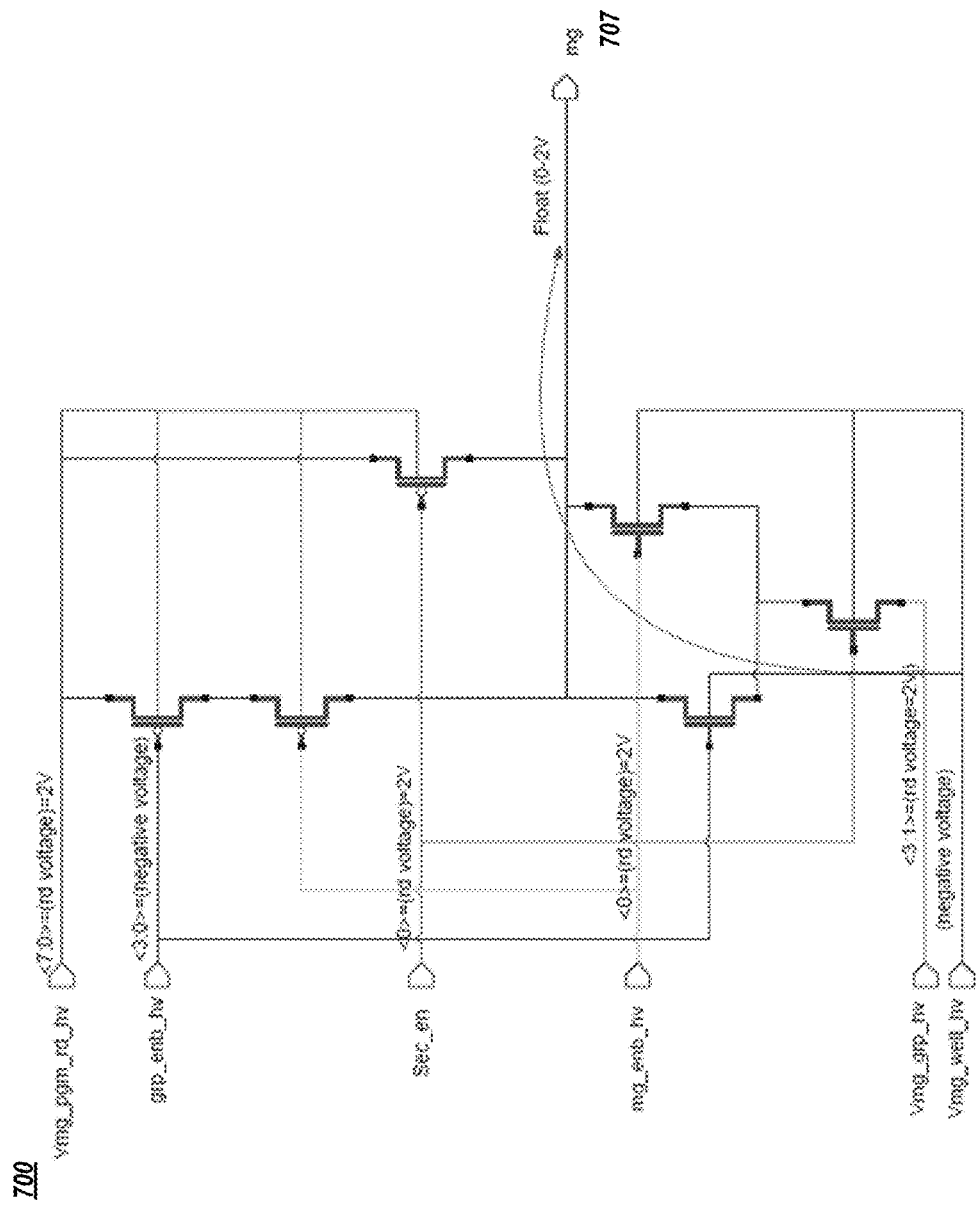
FIG. 7H illustrates a memory gate driver providing a memory gate signal, according to another embodiment.
Figure 7I:
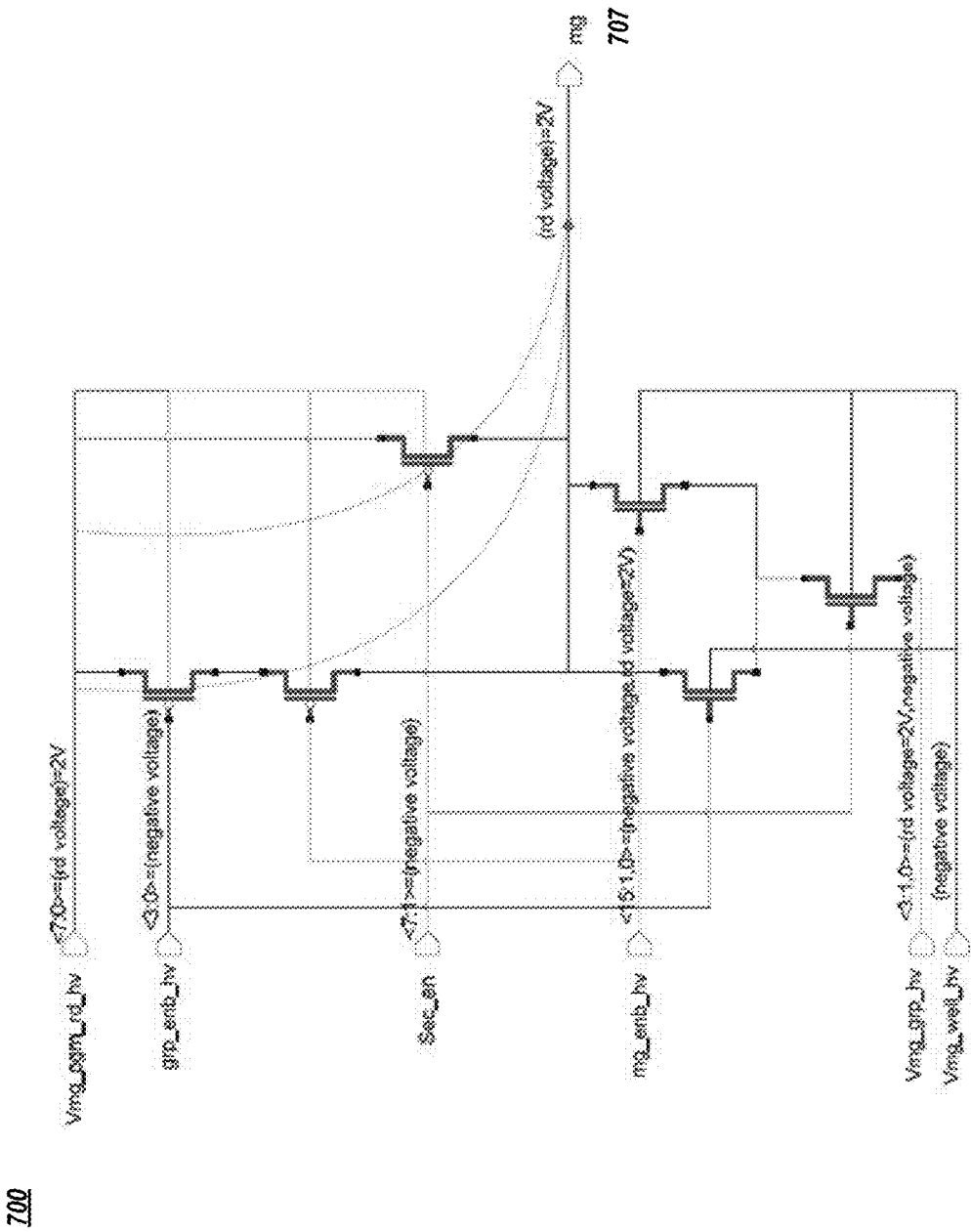
FIG. 7I illustrates a memory gate driver providing a memory gate signal, according to an embodiment.

FIG. 7G depicts gate-control circuitry 700 driving a read signal to an unselected MG line in an unselected group. Accordingly, the MG line coupled to node 707 (in FIG. 7G) is driven to the read voltage. FIG. 7H depicts gate-control circuitry 700 driving a read signal to a selected MG line in an unselected group. Accordingly, the MG line coupled to node 707 (in FIG. 7H) is driven to the read voltage. FIG. 7I depicts gate-control circuitry 700 driving a read signal to an unselected sector. Accordingly, the MG line coupled to node 707 (in FIG. 7I) is driven to the read voltage.

Table 4 summarizes an embodiment of the MG supply signals and controls during the various modes of operation.

TABLE 4

| Signal | RD | PGM | ERS | VT |
|---|---|---|---|---|
| vmg_pgm_rd<7:0> | 3.5 V | 10 V | 2 V | (2 V or 7 V)/2 V |
| vmg_grp<3:0> | 3.5 V | 4 V/3.5 V | −8 V/2 V | (−3 V:5.5 V)/2 V |
| mg_enb<15:0> | 0 V | 0/10 V | 2 V/−8 V | −4.5 V or 0 V |
| grp_enb<3:0> | 0 V | 0/10 V | −8 V | (−4.5 or 0 V)/ (2 V or 7 V) |
| Sec_en<7:0> | 0 V | 10 V/0 | 2 V/−8 V | (2 V or 7 V)/ (−4.5 V or 0 V) |
| Vmg_well | 0 V | 0 V | −8 V | −3 V:0 V/0 V |

Figure 8:
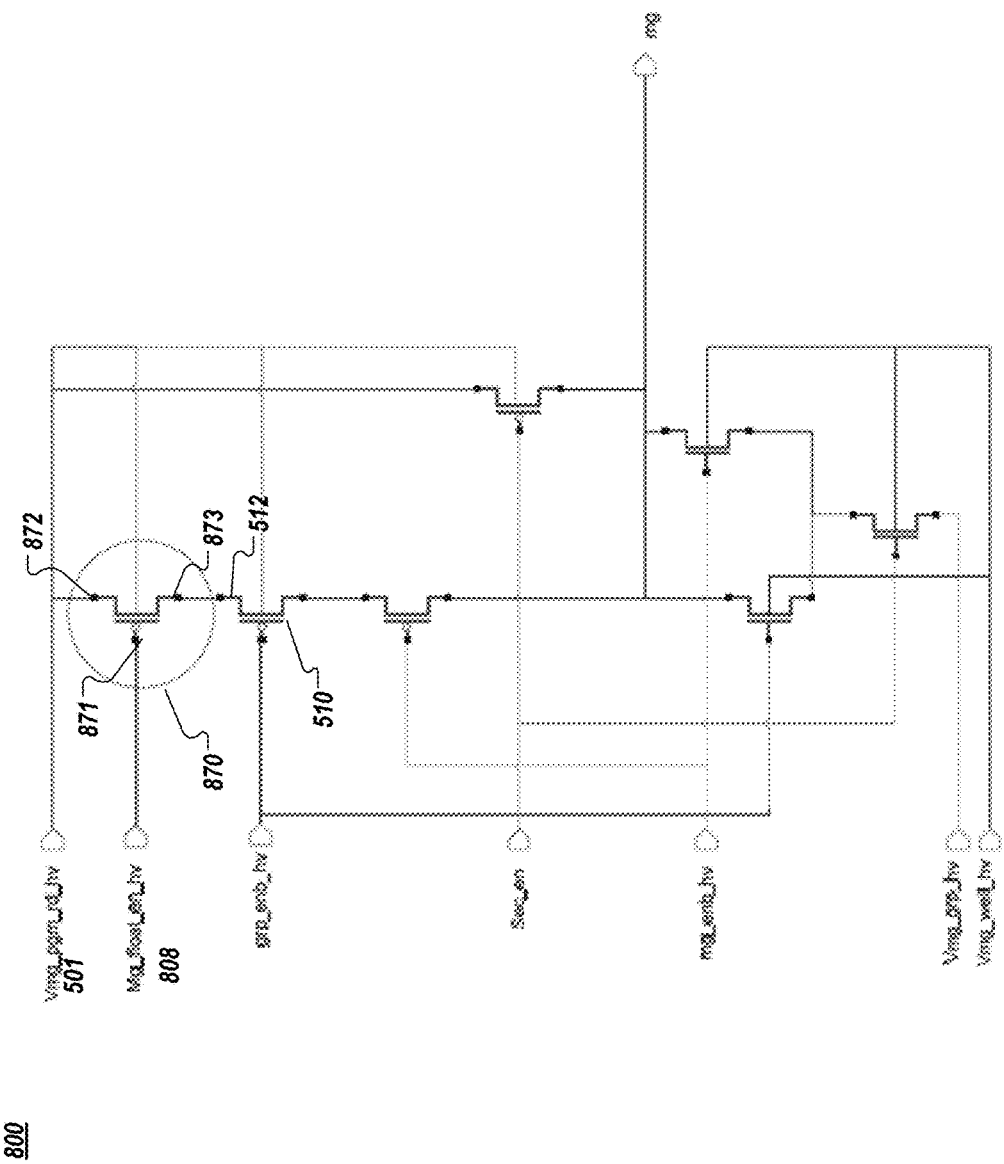
FIG. 8 illustrates a memory gate driver providing a memory gate signal, according to an embodiment.

FIG. 8 depicts an embodiment of gate-control 800 (or MG driver circuitry). Gate-control circuitry 800 is similar to gate-control circuitry 500 except that gate-control circuitry 800 includes an additional transistor 870 (e.g., PMOS transistor). Transistor 870 provides a float function to the MG driver circuitry to prevent supplies to connect to a shorted MG line. The float functionality is also used when a physical sector is defected and needs to be replaced with another sector. In this scenario, the defected sector's MG lines are not driven to avoid contention currents on the MG lines due to the defect of the physical sector.

Transistor 870 includes gate 871 and terminals 872 and 873. Transistor 870 is coupled to terminal 512 of transistor 510. Transistor 870 is coupled to receive supply signal 501 at terminal 872 and control signal 808 at gate 871.

Figure 9:
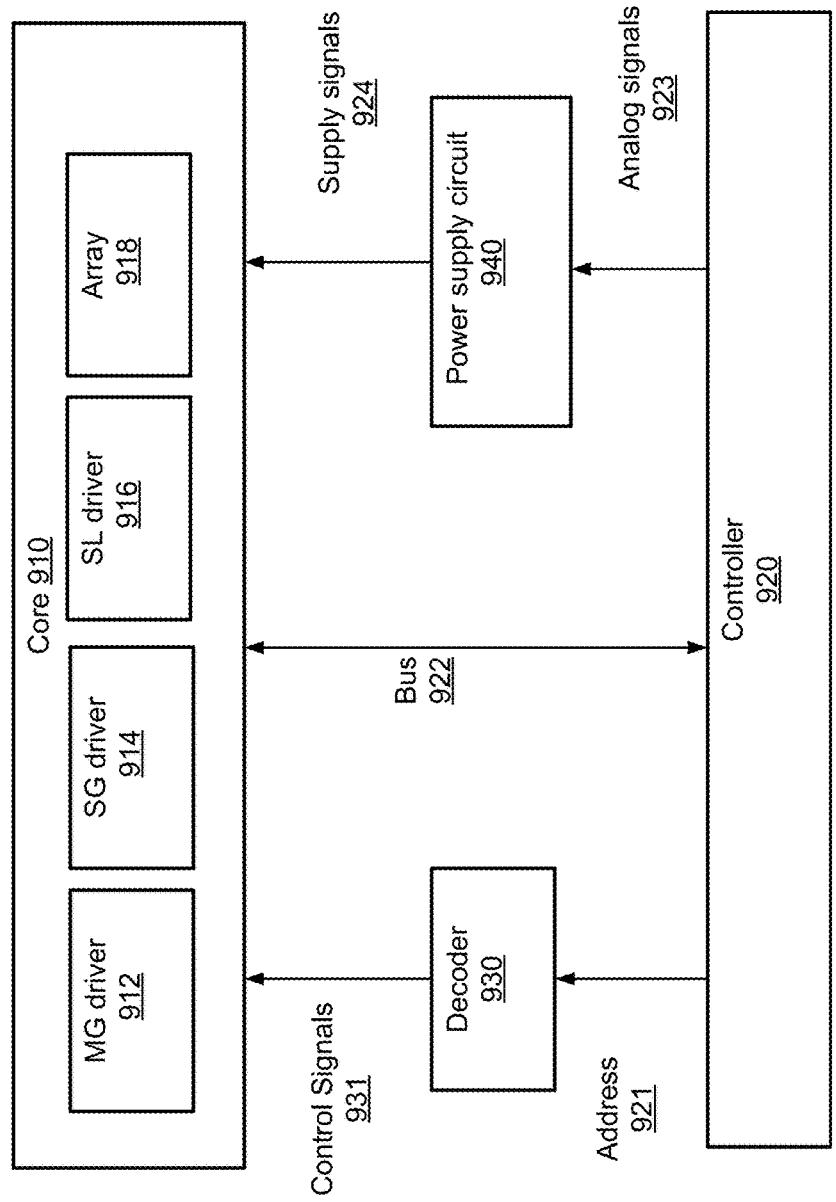
FIG. 9 illustrates a core having an MG driver, SG driver, a SL driver, and a memory array, according to an embodiment.

FIG. 9 depicts an embodiment of an flash memory 900. Memory 900 includes core 910. Core 910 includes flash memory array 918. Memory array 918 includes a plurality of memory cells 110. In one embodiment, memory array 918 includes numerous sectors of memory cells (see at least FIGS. 2-4C). Core 910 includes MG driver 912 to drive the various MG lines in array 918. MG driver 912, in various embodiments, corresponds to at least circuitry 103, 230, 360 or 460 as described herein. MG driver 912, in various embodiments, includes gate-control circuitry 500, 600, 700 or 800, as described herein. SG driver 914 drives the signals to the SG lines, as described herein. SL driver 916 drives the signals to the SL lines, as described herein. It should be appreciated that one or more of MG driver 912, SG driver 914, and SL driver 916 may reside outside of core 910.

Controller 920 is communicatively coupled to core 910 via bus 922. Controller 920 provides the address 921 of one or more memory cells to decoder 930. In response to receiving address 921, decoder 930 provides control signals 931 (e.g., control signals 504, 505 and 506) to core 910. Additionally, controller 920 provides analog signals to power supply circuit 940. In response to receiving analog signals 923, power supply circuit 940 provides supply signals 924 (e.g., supply signals 501, 502, and 503) to core 910.

Figure 10:
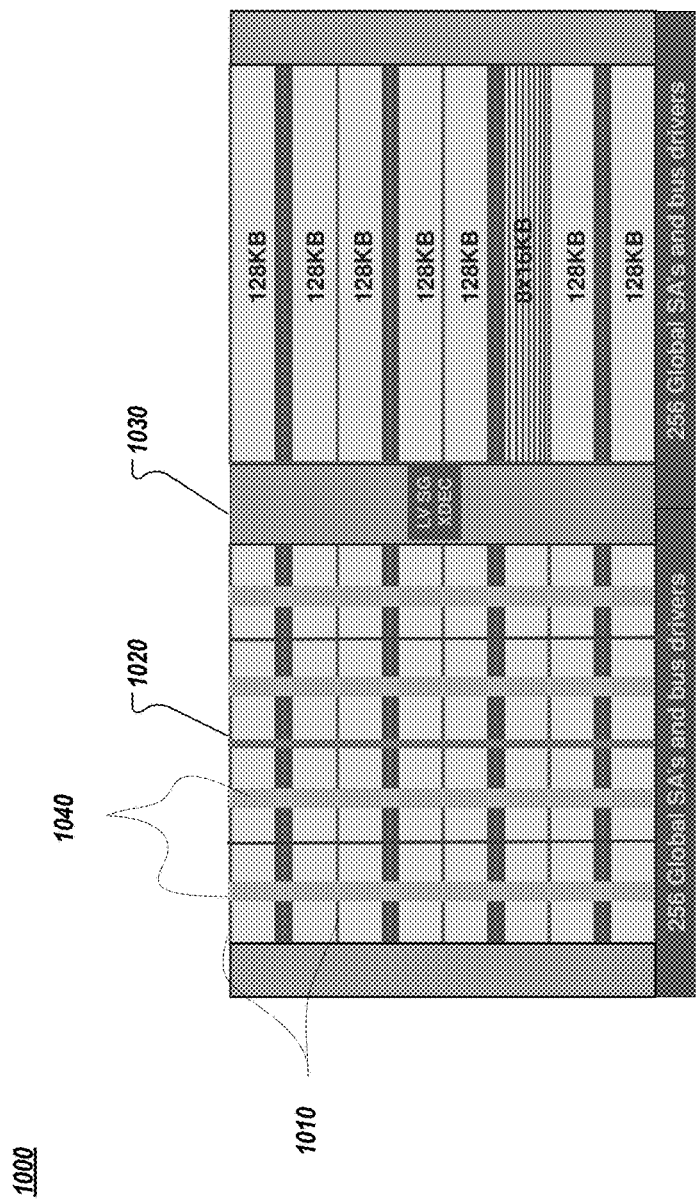
FIG. 10 illustrates an integrated circuit having MG driver circuitry and an eCT flash memory array, according to an embodiment.

FIG. 10 depicts an embodiment of memory array 1000. Memory array 1000 includes several sectors 1010. In one embodiment, the sectors are 8×2 kb in size. The sectors 1010 share MG lines 1020, SG lines, and SLs 1040. Memory array 1000 depicts an embodiment of memory architecture. However, memory array 1000 can include different types of memory architecture.

In view of the description provided herein, the memory architecture supports different modes of operation. This is done, based in part, by driving different MG lines in the same physical sector to different voltages, driving different MG lines in several physical sectors to different voltages, and supporting read mode during a write operation in the same memory core.

The memory architecture is provided with a very small overhead from the MG driver circuitry. In one embodiment, the overhead of the MG driver circuitry is 1.8% of the physical area of the memory array. This enables for driving different concurrent voltages in a memory array without unduly increasing the size of the memory array from the MG driver circuitry.

Various embodiments described herein are directed to flash memory. However, it should be appreciated that the features and functionality such as memory arrays, memory cells, MG driver circuitry, as described herein, may also be implemented in other NVM.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, flash memory; or another type of medium suitable for storing electronic instructions.

Additionally, some embodiments may be practiced in distributed computing environments where the machine-readable medium is stored on and or executed by more than one computer system. In addition, the information transferred between computer systems may either be pulled or pushed across the communication medium connecting the computer systems.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and or alternating manner. The terms "first," "second," "third," "fourth," etc. as used herein are meant as labels to distinguish among different elements and may not necessarily have an ordinal meaning according to their numerical designation. As used herein, the term "coupled" may mean connected directly or indirectly through one or more intervening components. Any of the signals provided over various buses described herein may be time multiplexed with other signals and provided over one or more common on-die buses. Additionally, the interconnection and interfaces between circuit components or blocks may be shown as buses or as single signal lines. Each of the buses may alternatively be one or more single signal lines and each of the single signal lines may alternatively be buses.

The above description sets forth numerous specific details such as examples of specific systems, components, methods, and so forth, in order to provide an understanding of several embodiments of the present invention. It may be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

What is claimed is:

1. A memory circuit comprising:
a first memory cell comprising a first memory gate coupled to receive a first signal from a gate-control circuit;
a second memory cell comprising a second memory gate coupled to receive a second signal, wherein a magnitude of the second signal is different than a magnitude of the first signal; and
a third memory cell comprising a third memory gate coupled to receive a third signal, wherein a magnitude of the third signal is different than the magnitude of the first signal and the magnitude of the second signal, and wherein the first signal, the second signal and the third signal are received concurrently; wherein the gate-control circuit comprises:
a first transistor coupled to a first supply signal and controlled by a first control signal;
a second transistor controlled by a third control signal;
a third transistor coupled to the first supply signal and controlled by a second control signal;
a fourth transistor coupled to a second supply signal and controlled by the second control signal;
a fifth transistor coupled to a third supply signal and controlled by the first control signal;
a sixth transistor coupled to the third supply signal and controlled by the second control signal; and
an output node coupled to the second transistor, the third transistor, the fifth transistor, and the sixth transistor, the output node to send the first signal to the first memory gate of the first memory cell.

2. The memory circuit of claim 1, wherein the first signal is a voltage signal to cause the first memory cell to program or erase.

3. The memory circuit of claim 1, wherein the second signal is a voltage signal to cause the second memory cell to inhibit program or inhibit erase.

4. The memory circuit of claim 1, wherein:
the first memory cell comprises a first source line terminal; and the second memory cell comprises a second source line terminal coupled to the first source line terminal of the first memory cell.

5. The memory circuit of claim 4, wherein the third memory cell comprises a third source line terminal, wherein the third source line terminal of the third memory cell is not coupled to the first source line terminal of the first memory cell and the second source line terminal of the second memory cell.

6. The memory circuit of claim 1, wherein the magnitude of the first signal is greater than the magnitude of the second signal, and the magnitude of the second signal is greater than the magnitude of the third signal.

7. A circuit comprising:
a gate-control circuit coupled to a first gate of a first split-gate memory cell, a second gate of a second split-gate memory cell, and a third gate of a third split-gate memory cell, wherein the gate-control circuit is to:
send a first signal with a first voltage to the first gate of the first split-gate memory cell;
send a second signal with a second voltage to the second gate of the second split-gate memory cell, wherein a magnitude of the second voltage is different than a magnitude of the first voltage; and
send a third signal with a third voltage to the third gate of the third split-gate memory cell, wherein a magnitude of the third voltage is different than the magnitude of the first voltage and the magnitude of the second voltage, and wherein the first signal, the second signal and the third signal are received concurrently, wherein the gate-control circuit comprises:
a first transistor coupled to receive:
a first supply signal at a first terminal; and
a first control signal at a first gate;
a second transistor coupled to receive a third control signal at a first gate;
a third transistor coupled to receive:
a second control signal at a first gate; and
the first supply signal at a first terminal;
a fourth transistor coupled to receive:
a second supply signal at a second terminal; and
the second control signal at a first gate;
a fifth transistor coupled to receive the second control signal at a first gate;
a sixth transistor coupled to receive the third control signal at a first gate; and
an output node coupled to:
the first gate of the first split-gate memory cell;
a second terminal of the third transistor;
a second terminal of the second transistor;
a first terminal of the fifth transistor; and
a first terminal of the sixth transistor.

8. The circuit of claim 7, wherein the first signal with the first voltage causes the first split-gate memory cell to program or erase.

9. The circuit of claim 7, wherein the second signal with the second voltage causes the second split-gate memory cell to inhibit program or inhibit erase.

10. The circuit of claim 7, wherein:
the first split-gate memory cell comprises a first source line terminal; and the second split-gate memory cell comprises a second source line terminal coupled to the first source line terminal of the first memory cell.

11. The circuit of claim 10, further comprising:
a seventh transistor coupled to receive:
the first supply signal at a first terminal; and
a fourth control signal at a first gate, wherein the first terminal of the first transistor is coupled to a second terminal of the seventh transistor.

12. A circuit comprising:
a first memory cell comprising a first memory gate; a second memory cell comprising a second memory gate; a third memory cell comprising a third memory gate; and
a first driver configured to provide a first signal to the first memory gate of the first memory cell, wherein the first driver comprises:
a first transistor coupled to receive:
a first supply signal at a first terminal; and
a first control signal at a first gate;
a second transistor coupled to receive a third control signal at a first gate;
a third transistor coupled to receive:
a second control signal at a first gate; and
the first supply signal at a first terminal;
a fourth transistor coupled to receive:
a second supply signal at a second terminal; and
the second control signal at a first gate;
a fifth transistor coupled to receive the second control signal at a first gate;

a sixth transistor coupled to receive the third control signal at a first gate; and
an output node coupled to:
the first memory gate;
a second terminal of the third transistor;
a second terminal of the second transistor;
a first terminal of the fifth transistor; and
a first terminal of the sixth transistor.

13. The circuit of claim 12, wherein the first signal causes the first memory cell to program.

14. The circuit of claim 12, wherein the first signal causes the first memory cell to erase.

15. The circuit of claim 12, wherein the second signal causes the second memory cell to inhibit program or inhibit erase.

16. The circuit of claim 12, wherein:
the first memory cell comprises a first source line terminal; and the second memory cell comprises a second source line terminal coupled to the first source line terminal of the first memory cell.

17. The circuit of claim 12, wherein the first driver further comprises a seventh transistor coupled to receive:
the first supply signal at a first terminal; and
a fourth control signal at a first gate, wherein the first terminal of the first transistor is coupled to a second terminal of the seventh transistor.

18. The circuit of claim 12, further comprising:
a second driver configured to provide a second signal to the second memory gate of the second memory cell, wherein a magnitude of the second signal is different than a magnitude of the first signal; and
a third driver configured to provide a third signal to the third memory gate of the third memory cell, wherein a magnitude of the third signal is different than the magnitude of the first signal and the magnitude of the second signal, and wherein the first signal, the second signal and the third signal are received concurrently.

19. The circuit of claim 18, wherein the magnitude of the first signal is greater than the magnitude of the second signal, and the magnitude of the second signal is greater than the magnitude of the third signal.

* * * * *